US012588222B2

(12) United States Patent
Tsai et al.

(10) Patent No.: US 12,588,222 B2
(45) **Date of Patent: \*Mar. 24, 2026**

(54) SEMICONDUCTOR PACKAGE INCLUDING AN INTEGRATED CIRCUIT DIE AND AN INDUCTOR OR A TRANSFORMER

(71) Applicant: Taiwan Semiconductor Manufacturing Co., Ltd., Hsinchu (TW)

(72) Inventors: Chung-Hao Tsai, Huatan Township (TW); Chia-Chia Lin, Kaohsiung City (TW); Kai-Chiang Wu, Hsinchu (TW); Chuei-Tang Wang, Taichung City (TW); Chen-Hua Yu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/663,697

(22) Filed: May 14, 2024

(65) Prior Publication Data

US 2024/0297131 A1 Sep. 5, 2024

Related U.S. Application Data

(60) Continuation of application No. 17/727,242, filed on Apr. 22, 2022, now Pat. No. 12,021,047, which is a (Continued)

(51) Int. Cl.
*H01L 23/31* (2006.01)
*H01L 21/48* (2006.01)
(Continued)

(52) U.S. Cl.
CPC ............ *H01L 24/04* (2013.01); *H01L 21/486* (2013.01); *H01L 21/56* (2013.01); *H01L 23/145* (2013.01);
(Continued)

(58) Field of Classification Search
CPC ............. H01L 23/481; H01L 23/49827; H01L 23/5227; H01L 25/0652; H01L 21/486;
(Continued)

(56) References Cited

U.S. PATENT DOCUMENTS 6,545,354 B1 4/2003 Aoki et al.
7,911,044 B2 3/2011 Yang et al.
(Continued)

FOREIGN PATENT DOCUMENTS

CN 101211903 A 7/2008
CN 104079275 A 10/2014
(Continued)

*Primary Examiner* — Khiem D Nguyen
(74) *Attorney, Agent, or Firm* — Slater Matsil, LLP

(57) ABSTRACT

An embodiment is a device including an integrated circuit die having an active side and a back side, the back side being opposite the active side, a molding compound encapsulating the integrated circuit die, and a first redistribution structure overlying the integrated circuit die and the molding compound, the first redistribution structure including a first metallization pattern and a first dielectric layer, the first metallization pattern being electrically coupled to the active side of the integrated circuit die, at least a portion of the first metallization pattern forming an inductor.

20 Claims, 47 Drawing Sheets

Related U.S. Application Data division of application No. 16/177,643, filed on Nov. 1, 2018, now Pat. No. 11,315,891.

(60) Provisional application No. 62/647,371, filed on Mar. 23, 2018.

(51) Int. Cl.

| | |
|---|---|
| *H01L 21/56* | (2006.01) |
| *H01L 23/00* | (2006.01) |
| *H01L 23/14* | (2006.01) |
| *H01L 23/48* | (2006.01) |
| *H01L 23/498* | (2006.01) |
| *H01L 23/522* | (2006.01) |
| *H01L 23/525* | (2006.01) |
| *H01L 23/66* | (2006.01) |
| *H01L 25/065* | (2023.01) |
| *H01L 25/07* | (2006.01) |
| *H10D 1/20* | (2025.01) |

(52) U.S. Cl.

CPC .......... *H01L 23/31* (2013.01); *H01L 23/3128* (2013.01); *H01L 23/481* (2013.01); *H01L 23/49827* (2013.01); *H01L 23/49838* (2013.01); *H01L 23/5227* (2013.01); *H01L 23/525* (2013.01); *H01L 23/66* (2013.01); *H01L 24/13* (2013.01); *H01L 24/18* (2013.01); *H01L 24/19* (2013.01); *H01L 24/20* (2013.01); *H01L 25/0652* (2013.01); *H01L 25/071* (2013.01); *H10D 1/20* (2025.01); *H01L 21/561* (2013.01); *H01L 2223/6672* (2013.01); *H01L 2223/6677* (2013.01); *H01L 2224/02205* (2013.01); *H01L 2224/02215* (2013.01); *H01L 2224/0231* (2013.01); *H01L 2224/02331* (2013.01); *H01L 2224/02373* (2013.01); *H01L 2224/02375* (2013.01); *H01L 2224/02379* (2013.01); *H01L 2224/02381* (2013.01); *H01L 2224/0401* (2013.01); *H01L 2224/10122* (2013.01); *H01L 2224/13024* (2013.01); *H01L 2224/18* (2013.01); *H01L 2224/92244* (2013.01)

(58) Field of Classification Search

CPC . H01L 21/56; H01L 2223/6672; H01L 23/66; H10D 1/20; H01Q 21/065

See application file for complete search history.

(56) References Cited

U.S. PATENT DOCUMENTS

| | | | |
|---|---|---|---|
| 8,445,323 | B2 | 5/2013 | Lin et al. |
| 8,445,990 | B2 | 5/2013 | Lin et al. |
| 8,836,114 | B2 | 9/2014 | Oh et al. |
| 8,853,819 | B2 | 10/2014 | Chen et al. |
| 8,877,554 | B2 | 11/2014 | Tsai et al. |
| 8,970,001 | B2 | 3/2015 | Lii et al. |
| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,209,131 | B2 | 12/2015 | Gu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 9,761,522 | B2 | 9/2017 | Chu et al. |
| 10,276,548 | B2 | 4/2019 | Chen et al. |
| 10,790,244 | B2 | 9/2020 | Huang et al. |
| 12,021,047 | B2* | 6/2024 | Tsai ..................... H01L 25/071 |
| 2009/0236690 | A1 | 9/2009 | Hamamoto et al. |
| 2011/0155433 | A1 | 6/2011 | Funaya et al. |
| 2012/0086102 | A1* | 4/2012 | Hofmann ................. H10D 1/20 |
| | | | 257/E27.005 |
| 2012/0175779 | A1 | 7/2012 | Lin |
| 2013/0009320 | A1 | 1/2013 | Yoo et al. |
| 2014/0028543 | A1* | 1/2014 | Lo ....................... H01L 23/5227 |
| | | | 336/200 |
| 2014/0118976 | A1 | 5/2014 | Yoshikawa et al. |
| 2014/0152509 | A1 | 6/2014 | Liu et al. |
| 2014/0168014 | A1 | 6/2014 | Chih et al. |
| 2014/0183690 | A1 | 7/2014 | Lii et al. |
| 2014/0252646 | A1 | 9/2014 | Hung et al. |
| 2014/0252647 | A1 | 9/2014 | Huang et al. |
| 2014/0266494 | A1* | 9/2014 | Lan ..................... H10D 86/481 |
| | | | 333/32 |
| 2015/0137350 | A1 | 5/2015 | Huang et al. |
| 2015/0206837 | A1* | 7/2015 | Gu .................... H01L 21/76838 |
| | | | 438/381 |
| 2015/0280327 | A1* | 10/2015 | Spella .................. H01Q 19/108 |
| | | | 29/601 |
| 2016/0056126 | A1 | 2/2016 | Yu et al. |
| 2016/0071796 | A1* | 3/2016 | Dunn .................. H01L 23/5227 |
| | | | 257/531 |
| 2016/0181211 | A1 | 6/2016 | Kamgaing et al. |
| 2016/0247767 | A1 | 8/2016 | Kim et al. |
| 2016/0315071 | A1 | 10/2016 | Zhai et al. |
| 2016/0336299 | A1 | 11/2016 | Marimuthu et al. |
| 2017/0221820 | A1* | 8/2017 | Yu ........................... H01L 24/20 |
| 2017/0250138 | A1* | 8/2017 | Hsieh ................... H01L 21/486 |
| 2017/0263692 | A1* | 9/2017 | Liu ....................... H01L 23/645 |
| 2017/0345731 | A1 | 11/2017 | Chiang et al. |
| 2018/0076184 | A1* | 3/2018 | Chen ..................... H01L 24/73 |

FOREIGN PATENT DOCUMENTS

| | | |
|---|---|---|
| CN | 106169428 A | 11/2016 |
| CN | 106415832 A | 2/2017 |
| CN | 107818974 A | 3/2018 |
| JP | 2002231817 A | 8/2002 |
| JP | 2005019938 A | 1/2005 |
| KR | 20130005811 A | 1/2013 |
| KR | 20180030391 A | 3/2018 |
| TW | 201519379 A | 5/2015 |
| TW | 1575675 B | 3/2017 |
| WO | 2004109771 A2 | 12/2004 |
| WO | 2014071312 A1 | 5/2014 |

\* cited by examiner

SEMICONDUCTOR PACKAGE INCLUDING AN INTEGRATED CIRCUIT DIE AND AN INDUCTOR OR A TRANSFORMER

PRIORITY CLAIM AND CROSS-REFERENCE

This application is a continuation of U.S. patent application Ser. No. 17/727,242, filed Apr. 22, 2022, entitled "Semiconductor Packages Having a Die, an Encapsulant, and a Redistribution Structure," now U.S. Pat. No. 12,021, 047, issued Jun. 25, 2024, which is a divisional of U.S. patent application Ser. No. 16/177,643, filed on Nov. 1, 2018, entitled "Methods of Forming Semiconductor Packages having a Die with an Encapsulant", now U.S. Pat. No. 11,315,891, issued Apr. 26, 2022, which claims the benefit of U.S. Provisional Application No. 62/647,371, filed on Mar. 23, 2018, entitled "Semiconductor Package and Method," which applications is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 14B-1, 14B-2, 14B-3, 14B-4, 14B-5, 14B-6, 14B-7, and 14B-8 illustrate example schematics switch circuits with inductors/transformers being coupled to switches of the switch circuit in accordance with some embodiments.

DETAILED DESCRIPTION

Figure 1:
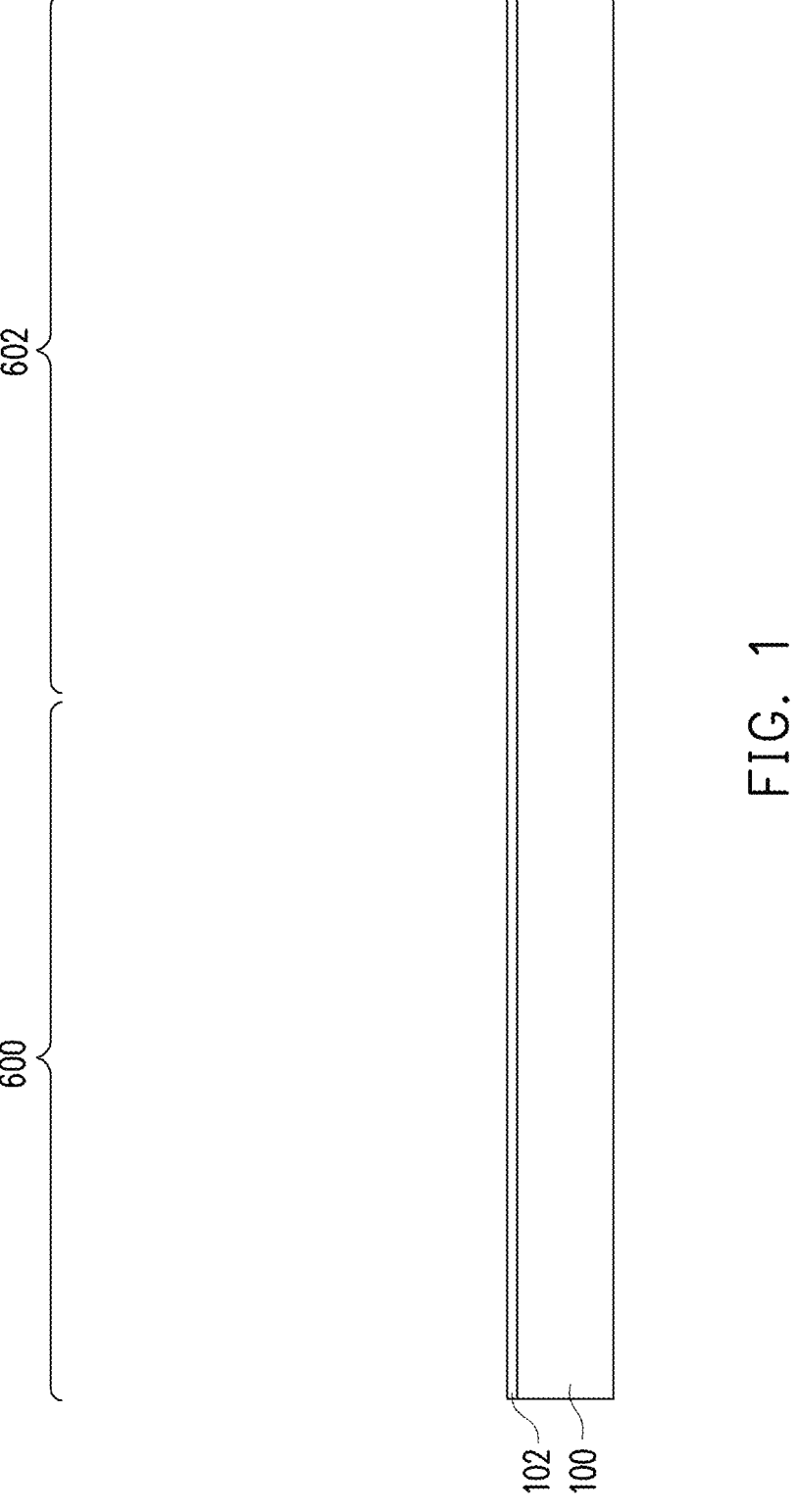
FIGS. 1, 2, 3, 4, 5, 6, 7, 8, 9, 10, 11, 12, 13, 14A, 15, 16, 17, 18A-1, 18A-2, 18B-1, 18B-2, 18B-3, 18B-4, 19, 20, 21, and 22 illustrate cross-sectional and plan views of intermediate steps during a process for forming a package structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An inductor is a passive electrical component that can store energy in a magnetic field created by an electric current passing through it. An inductor may be constructed as a coil of conductive material wrapped around a core of dielectric or magnetic material. One parameter of an inductor that may be measured is the inductor's ability to store magnetic energy, also known as the inductor's inductance. Another parameter that may be measured is the inductor's Quality (Q) factor. The Q factor of an inductor is a measure of the inductor's efficiency and may be calculated as the ratio of the inductor's inductive reactance to the inductor's resistance at a given frequency.

Embodiments discussed herein may be discussed in a specific context, namely a package structure (e.g., an integrated fan-out (InFO) package structure) having a component—such as an inductor, a transformer, or both—integrated into a redistribution structure. The component being integrated into the redistribution structure can provide low cost and high-performance component to improve performance of a radio frequency switch device. The improved performance of the radio frequency antenna switch may include improved insertion loss and improved isolation. For example, an inductor is able to cancel the parasitic/coupling effect of CMOS device. In addition, the disclosed embodiments include a protection layer to prevent oxidation of the conductive material of the inductor. Also, the disclosed embodiments include the conductive material of the inductor to be formed in a via trench of the redistribution structure to enable a higher Quality (Q) factor for the inductor and can also improve the performance of a transformer. Further, in some embodiments, the dielectric material of the redistribution structure adjacent the component can be removed (e.g., air gaps formed adjacent the component) to reduce the component's parasitic capacitance. The embodiments including the air gaps can improve the Q factor of the inductor and can also raise the self resonate frequency of the inductor. The disclosed embodiments including the inductor coupled to the radio frequency device switch can allow for the radio frequency switch device to have a lower power loss and a higher isolation when compared to a radio frequency switch device without an inductor and/or transformer.

Further, the teachings of this disclosure are applicable to any package structure including redistribution structures. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIGS. 1, 2, 3, 4, 5, 6, 7, 8, 9, 10, 11, 12, 13, 14A, 15, 16, 17, 18A-1, 18A-2, 18B-1, 18B-2, 18B-3, 18B-4, 19, 20, 21, and 22 illustrate cross-sectional views and plan views of intermediate steps during a process for forming a first package structure in accordance with some embodiments. FIG. 1 illustrates a carrier substrate 100 and a release layer 102 formed on the carrier substrate 100. A first package region 600 and a second package region 602 for the formation of a first package and a second package, respectively, are illustrated.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of coplanarity.

Figure 2:
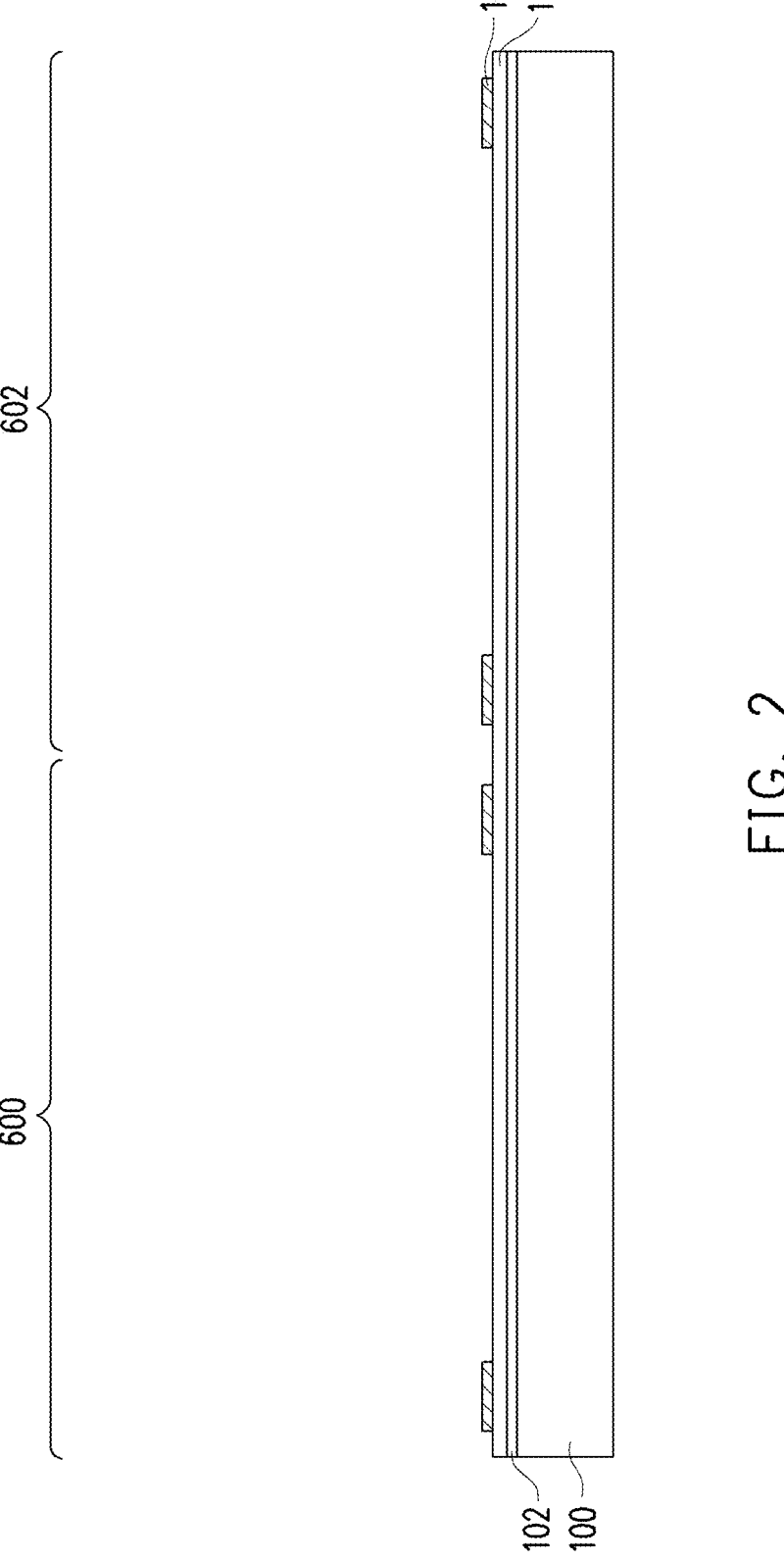

In FIG. 2, a dielectric layer 104 and a metallization pattern 106 (sometimes referred to as redistribution layers or redistribution lines) is formed. The dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106.

Figure 3:
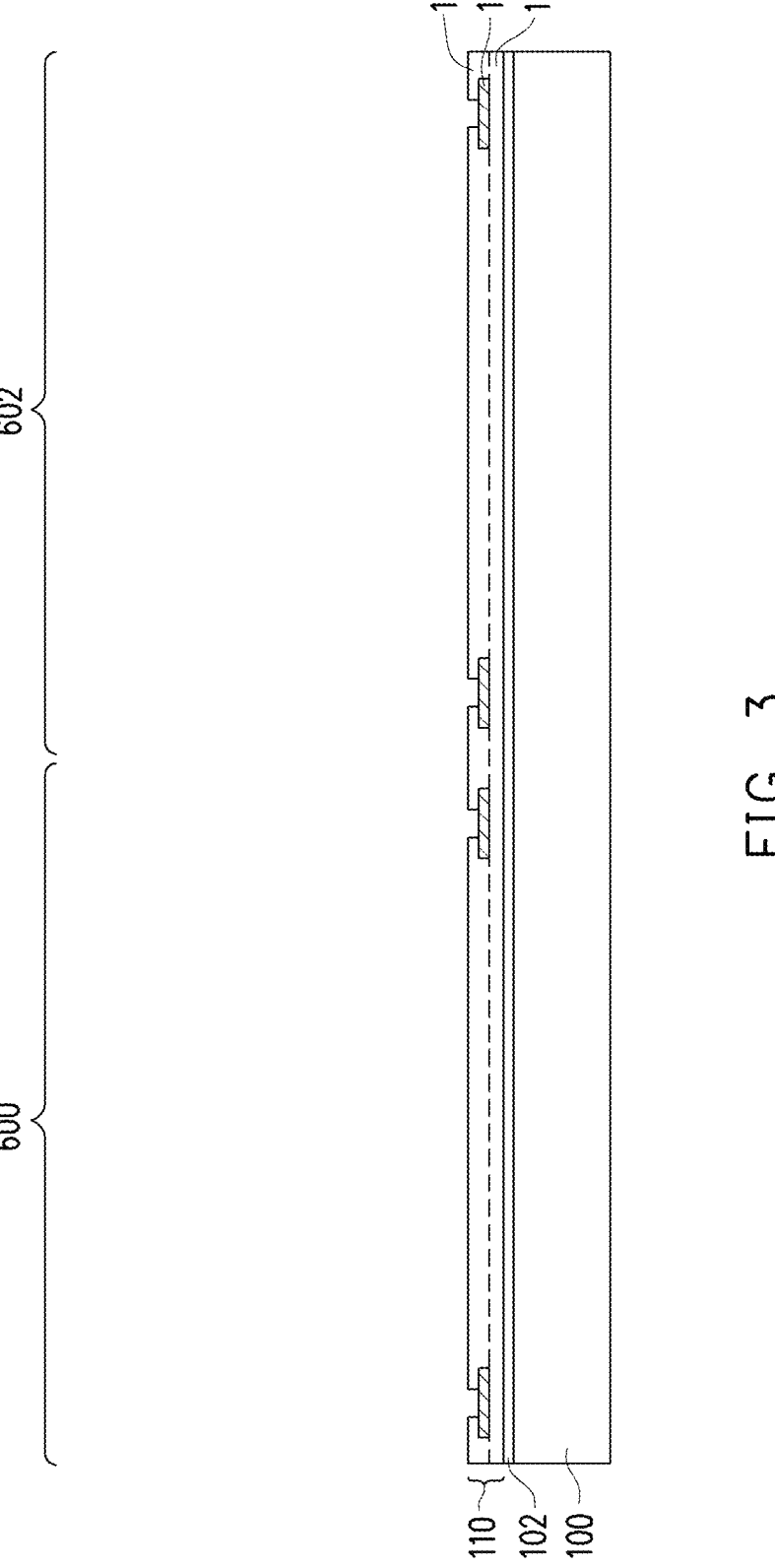

In FIG. 3, a dielectric layer 108 is formed on the metallization pattern 106 and the dielectric layer 104. In some embodiments, the dielectric layer 108 is formed of a polymer, which may be a photo-sensitive material such as PBO, polyimide, BCB, or the like, that may be patterned using a lithography mask. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings to expose portions of the metallization pattern 106. The patterning may be by an acceptable process, such as by exposing the dielectric layer 108 to light when the dielectric layer is a photo-sensitive material or by etching using, for example, an anisotropic etch.

The dielectric layers 104 and 108 and the metallization pattern 106 may be referred to as a back side redistribution structure 110. In the embodiment shown, the back side redistribution structure 110 includes the two dielectric layers 104 and 108 and one metallization pattern 106. In other embodiments, the back side redistribution structure 110 can include any number of dielectric layers, metallization patterns, and conductive vias. One or more additional metallization pattern and dielectric layer may be formed in the back side redistribution structure 110 by repeating the processes for forming the metallization pattern 106 and dielectric layer 108. Conductive vias (not shown) may be formed during the formation of a metallization pattern by forming the seed layer and conductive material of the metallization pattern in the opening of the underlying dielectric layer. The conductive vias may therefore interconnect and electrically couple the various metallization patterns.

Figure 4:
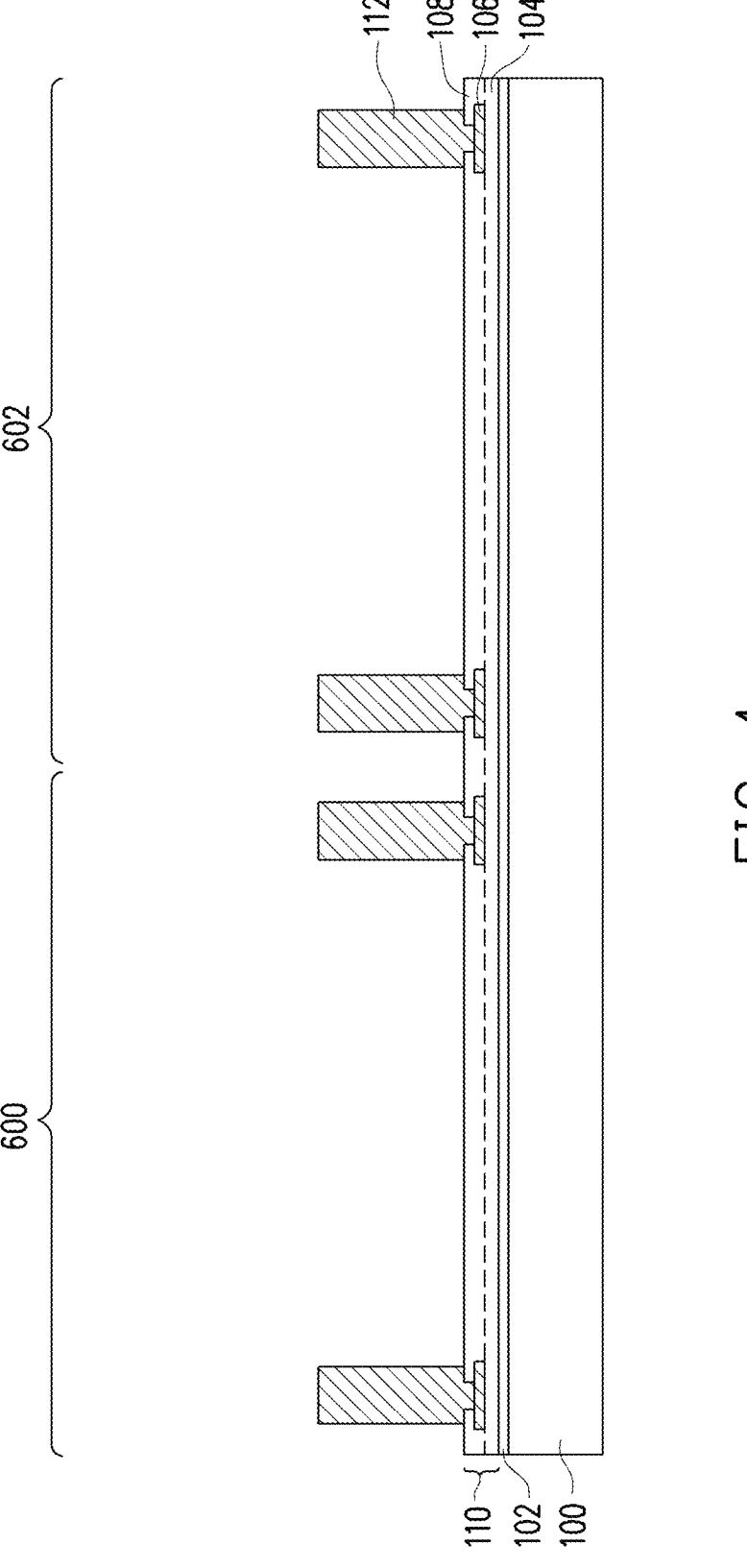

In FIG. 4, electrical connectors 112 are formed. The electrical connectors 112 will extend through the subsequently formed encapsulant 130 (see FIG. 7) and may be referred to as through vias 112 hereinafter. As an example, to form the through vias 112, a seed layer is formed over the back side redistribution structure 110, e.g., the dielectric layer 108 and the exposed portions of the metallization pattern 106 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the through vias 112.

Figure 5:
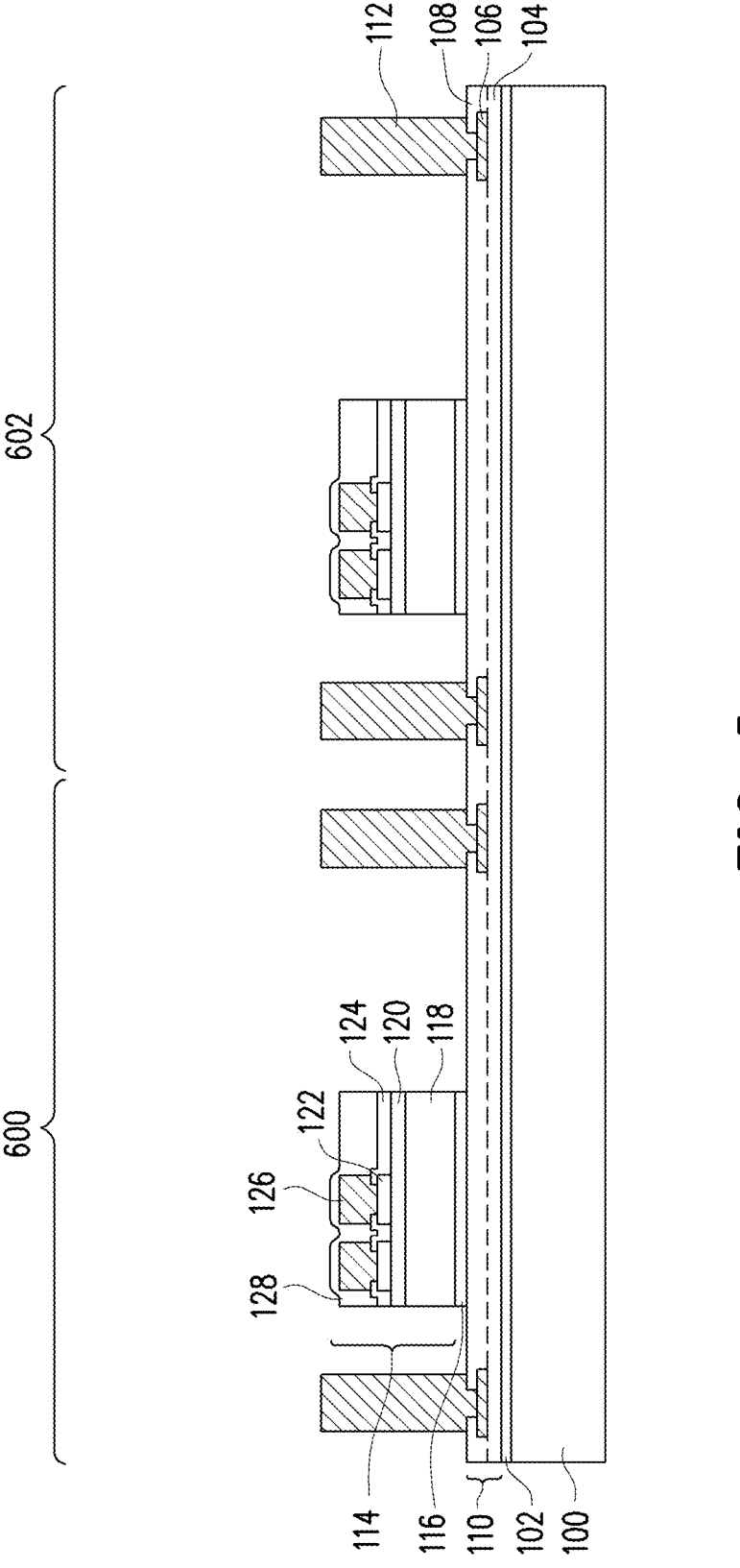

In FIG. 5, integrated circuit dies 114 are adhered to the dielectric layer 108 by an adhesive 116. Although one integrated circuit die 114 is illustrated as being adhered in each of the first package region 600 and the second package region 602, it should be appreciated that more integrated circuit dies 114 may be adhered in each package region. For example, two or three integrated circuit dies 114 may be adhered in each region. The integrated circuit dies 114 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 114 may be different sizes (e.g., different heights and/or surface areas), and in other embodiments, the integrated circuit dies 114 may be the same size (e.g., same heights and/or surface areas).

Before being adhered to the dielectric layer 108, the integrated circuit dies 114 may be processed according to applicable manufacturing processes to form integrated circuits in the integrated circuit dies 114. For example, the integrated circuit dies 114 each include a semiconductor substrate 118, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are through the passivation films 124 to the pads 122. Die connectors 126, such as conductive pillars (for example, comprising a metal such as copper), are in the openings through the passivation films 124 and are mechanically and electrically coupled to the respective pads 122. The die connectors 126 may be formed by, for example, plating, or the like. The die connectors 126 electrically couple the respective integrated circuits of the integrated circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally coterminous with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

The adhesive 116 is on back sides of the integrated circuit dies 114 and adheres the integrated circuit dies 114 to the back side redistribution structure 110, such as the dielectric layer 108. The adhesive 116 may be any suitable adhesive, epoxy, die attach film (DAF), or the like. The adhesive 116 may be applied to a back side of the integrated circuit dies 114, such as to a back side of the respective semiconductor wafer or may be applied over the surface of the carrier substrate 100. The integrated circuit dies 114 may be singulated, such as by sawing or dicing, and adhered to the dielectric layer 108 by the adhesive 116 using, for example, a pick-and-place tool.

Figure 6:
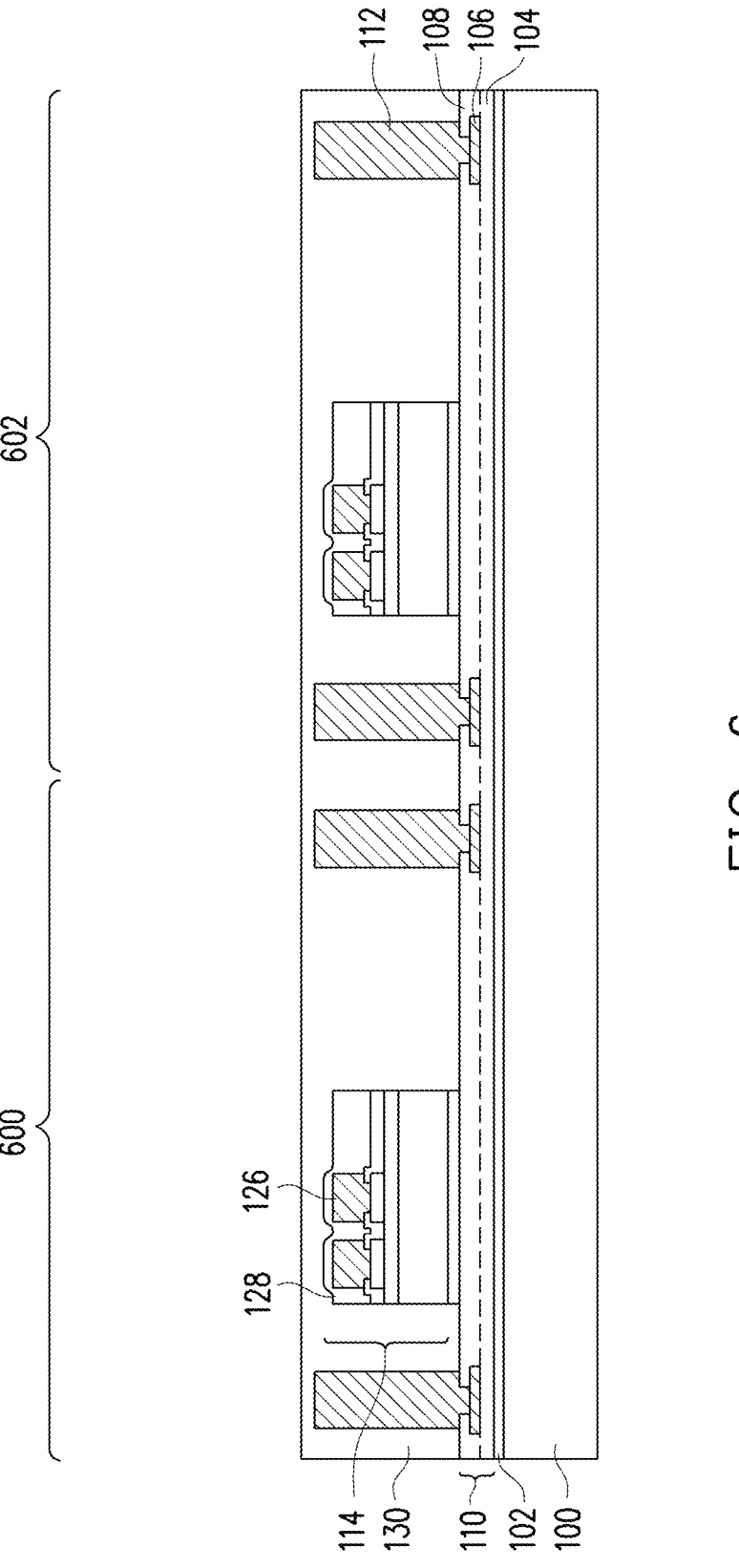

In FIG. 6, an encapsulant 130 is formed on the various components. The encapsulant 130 may be a molding compound, epoxy, or the like, and may be applied by compression molding, transfer molding, or the like. The encapsulant 130 may be formed over the carrier substrate 100 such that the through vias 112 and/or the die connectors 126 of the integrated circuit dies 114 are buried or covered. In some embodiments, the dielectric material 128 is omitted and the encapsulant 130 surrounds and passivates the die connectors 126. The encapsulant 130 is then cured.

Figure 7:
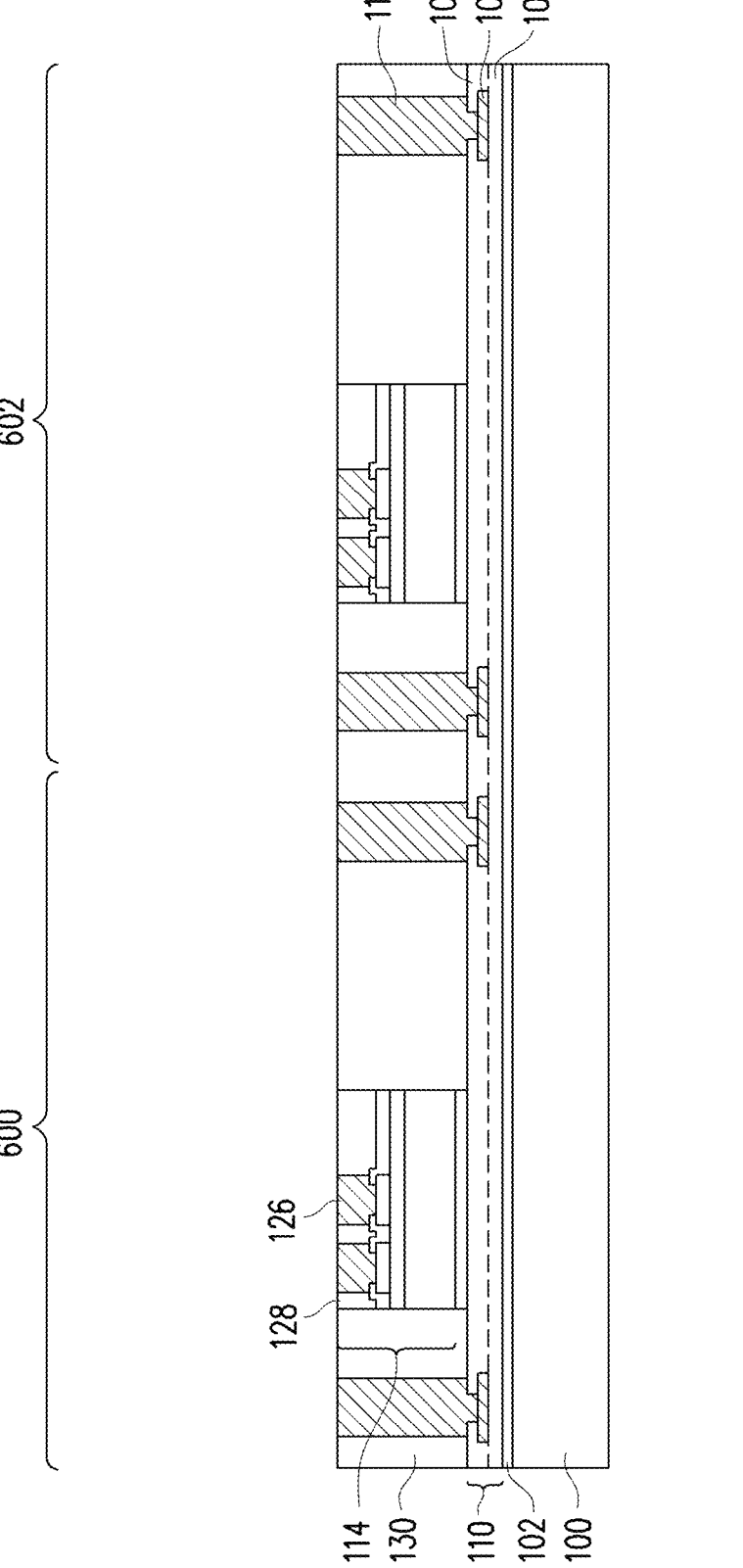

In FIG. 7, a planarization process is performed on the encapsulant 130 to expose the through vias 112 and the die connectors 126. The planarization process may also grind the dielectric material 128. Top surfaces of the through vias 112, die connectors 126, dielectric material 128, and encapsulant 130 are coplanar after the planarization process. The planarization process may be, for example, a chemical-mechanical polish (CMP), a grinding process, or the like. In some embodiments, the planarization may be omitted, for example, if the through vias 112 and die connectors 126 are already exposed.

In FIGS. 8 through 13, a front side redistribution structure 132 is formed. The front side redistribution structure 132 includes an integrated component 150, such as an inductor, a transformer, or both (see FIGS. 14A to 14B-8 and 15). The front side redistribution structure 132 includes dielectric layers 136 and 140 and metallization patterns 138 and 142.

The formation of the front side redistribution structure 132 may begin by depositing dielectric layer 136 on the encapsulant 130, through vias 112, and die connectors 126. In some embodiments, the dielectric layer 136 is formed of a polymer, which may be a photo-sensitive material such as PBO, polyimide, BCB, or the like, that may be patterned using a lithography mask. In other embodiments, the dielectric layer 136 is formed of a nitride such as silicon nitride; an oxide such as silicon oxide, PSG, BSG, BPSG; or the like. The dielectric layer 136 may be formed by spin coating, lamination, CVD, the like, or a combination thereof.

Figure 9:
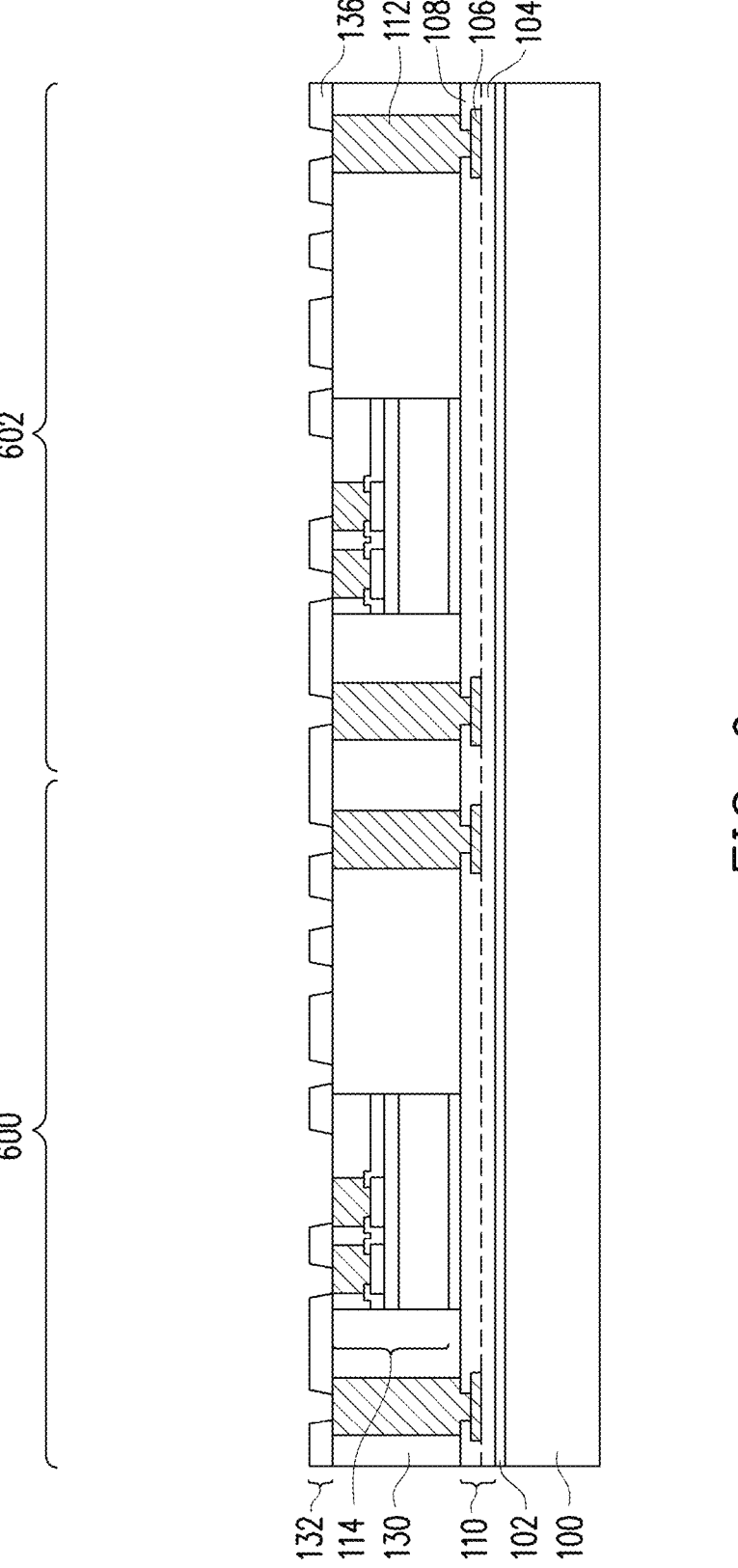

In FIG. 9, the dielectric layer 136 is patterned. The patterning forms openings to expose portions of the through vias 112 and the die connectors 126. The patterning may be by an acceptable process, such as by exposing the dielectric layer 136 to light when the dielectric layer 136 is a photo-sensitive material or by etching using, for example, an anisotropic etch. If the dielectric layer 136 is a photo-sensitive material, the dielectric layer 136 can be developed after the exposure.

Figure 10:
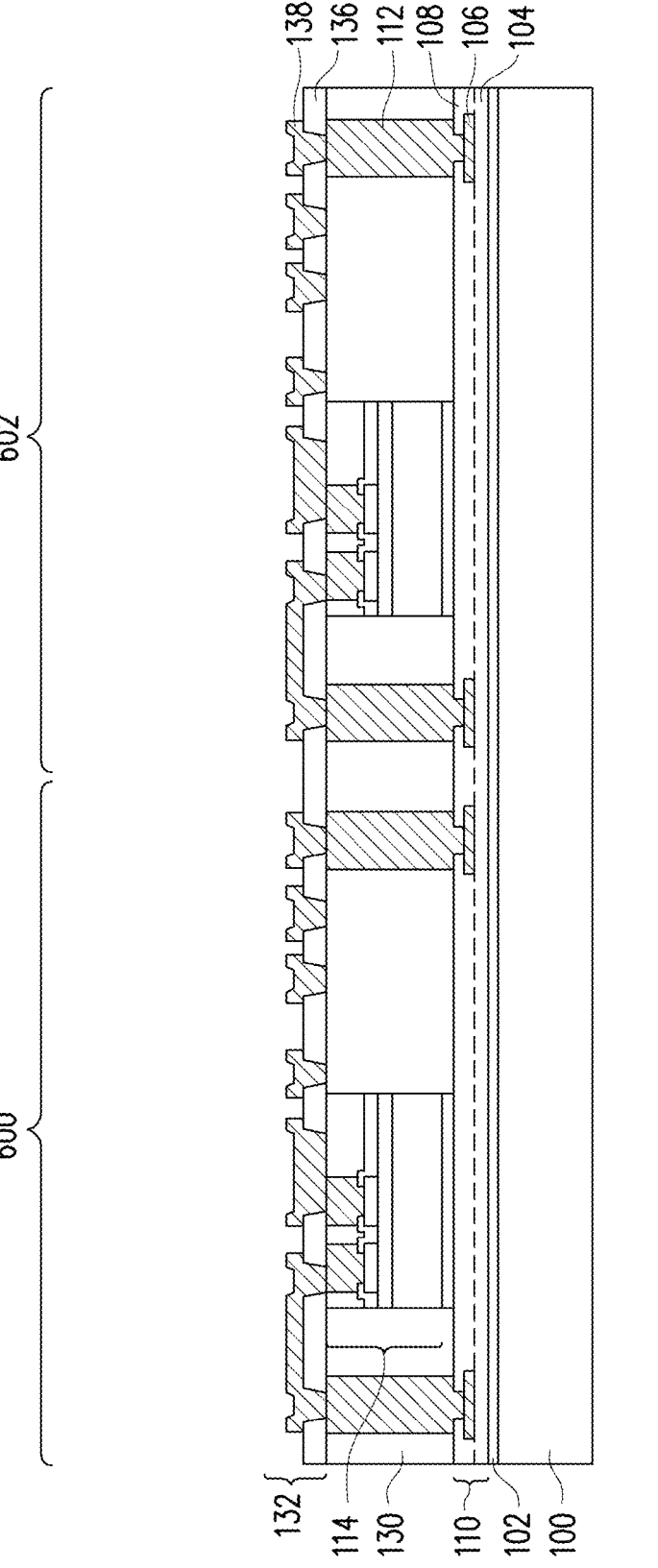

In FIG. 10, metallization pattern 138 with vias is formed on the dielectric layer 136. As an example, to form metallization pattern 138, a seed layer (not shown) is formed over the dielectric layer 136 and in openings through the dielectric layer 136. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 138. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 138 and vias. The vias are formed in openings through the dielectric layer 136 to, e.g., the through vias 112 and/or the die connectors 126.

Figure 11:
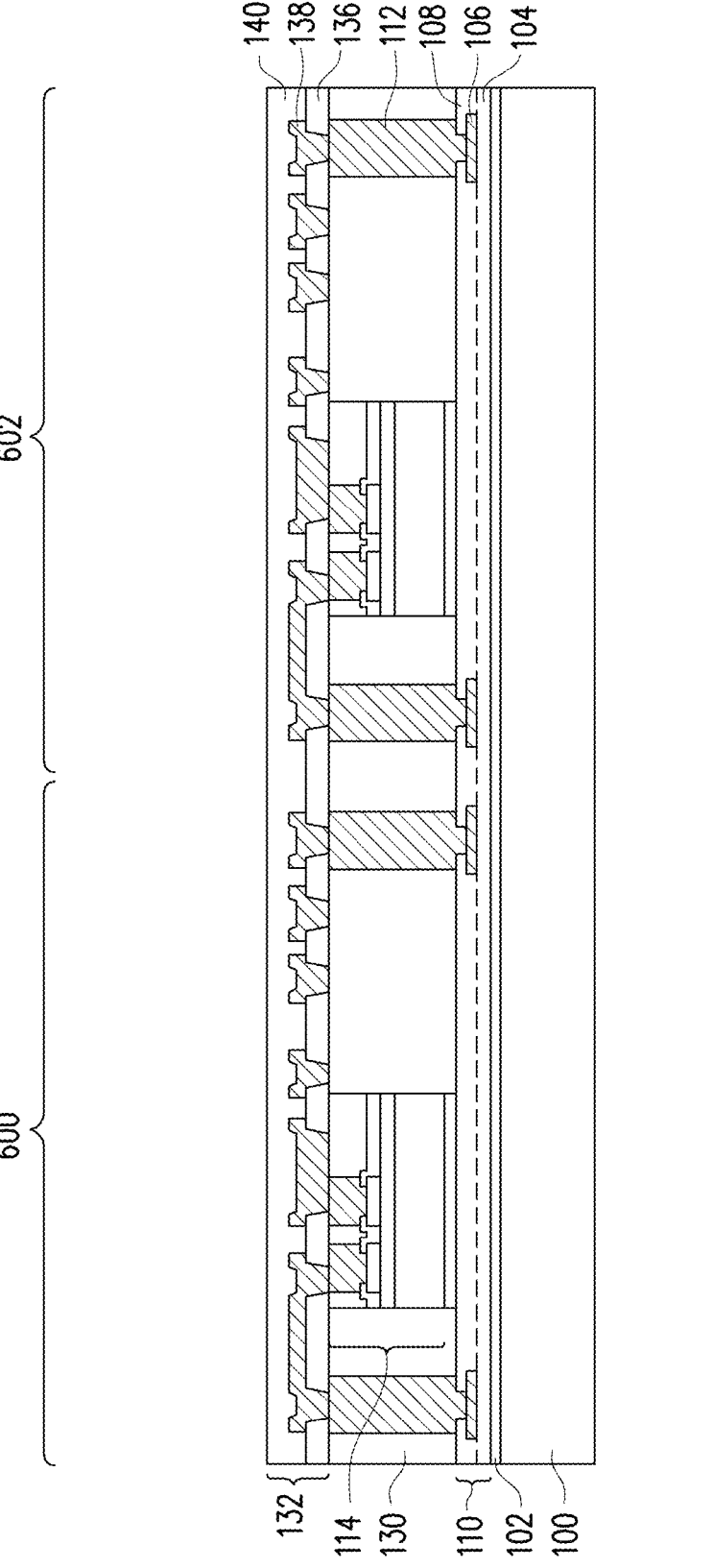

In FIG. 11, dielectric layer 140 is formed over the dielectric layer 136 and metallization pattern 138. The materials and processes used to form dielectric layer 140 may be similar to the dielectric layer 136 the description is not repeated herein.

Figure 12:
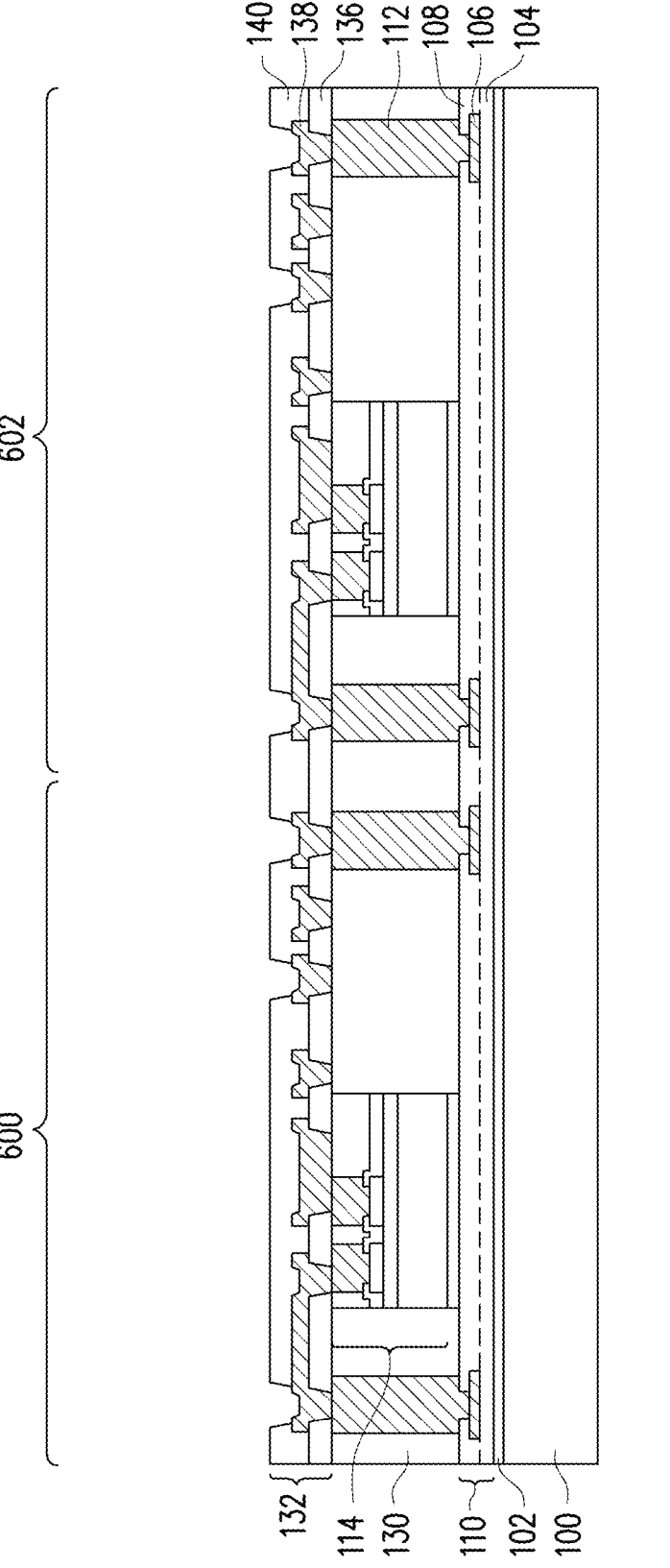

In FIG. 12, the dielectric layer 140 is then patterned. The patterning forms openings to expose portions of the metallization pattern 138. The patterning may be by an acceptable process, such as by exposing the dielectric layer 140 to light when the dielectric layer is a photo-sensitive material or by etching using, for example, an anisotropic etch. If the dielectric layer 140 is a photo-sensitive material, the dielectric layer 140 can be developed after the exposure.

Figure 13:
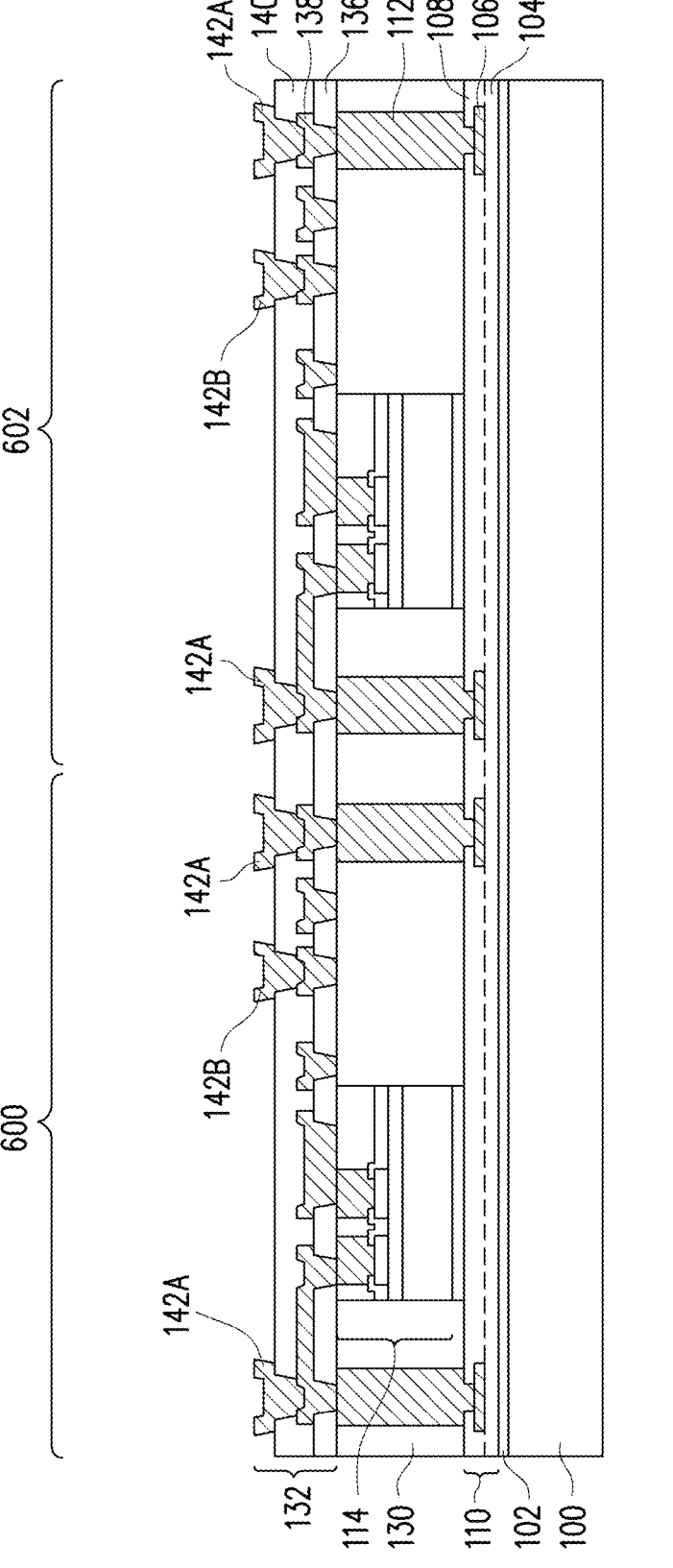

In FIG. 13, pads 142 are formed on the dielectric layer 140 and the metallization pattern 138. The pads 142 include pads 142A and pads 142B. The pads 142A are used to couple to conductive connectors 144 (see FIG. 14A) and may be referred to as under bump metallurgies (UBMs) 142A. The pads 142B are part of the integrated components 150 (see FIGS. 15 and 16) and may be referred to as component pads 142B. In the illustrated embodiment, the pads 142 are formed through openings through the dielectric layer 140 to the metallization pattern 138. As an example, to form the pads 142, a seed layer (not shown) is formed over the dielectric layer 140. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 142. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 142. In the embodiment, where the pads 142 are formed differently, more photo resist and patterning steps may be utilized.

The front side redistribution structure 132 is shown as an example. More or fewer dielectric layers and metallization patterns may be formed in the front side redistribution structure 132. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Figure 14A:
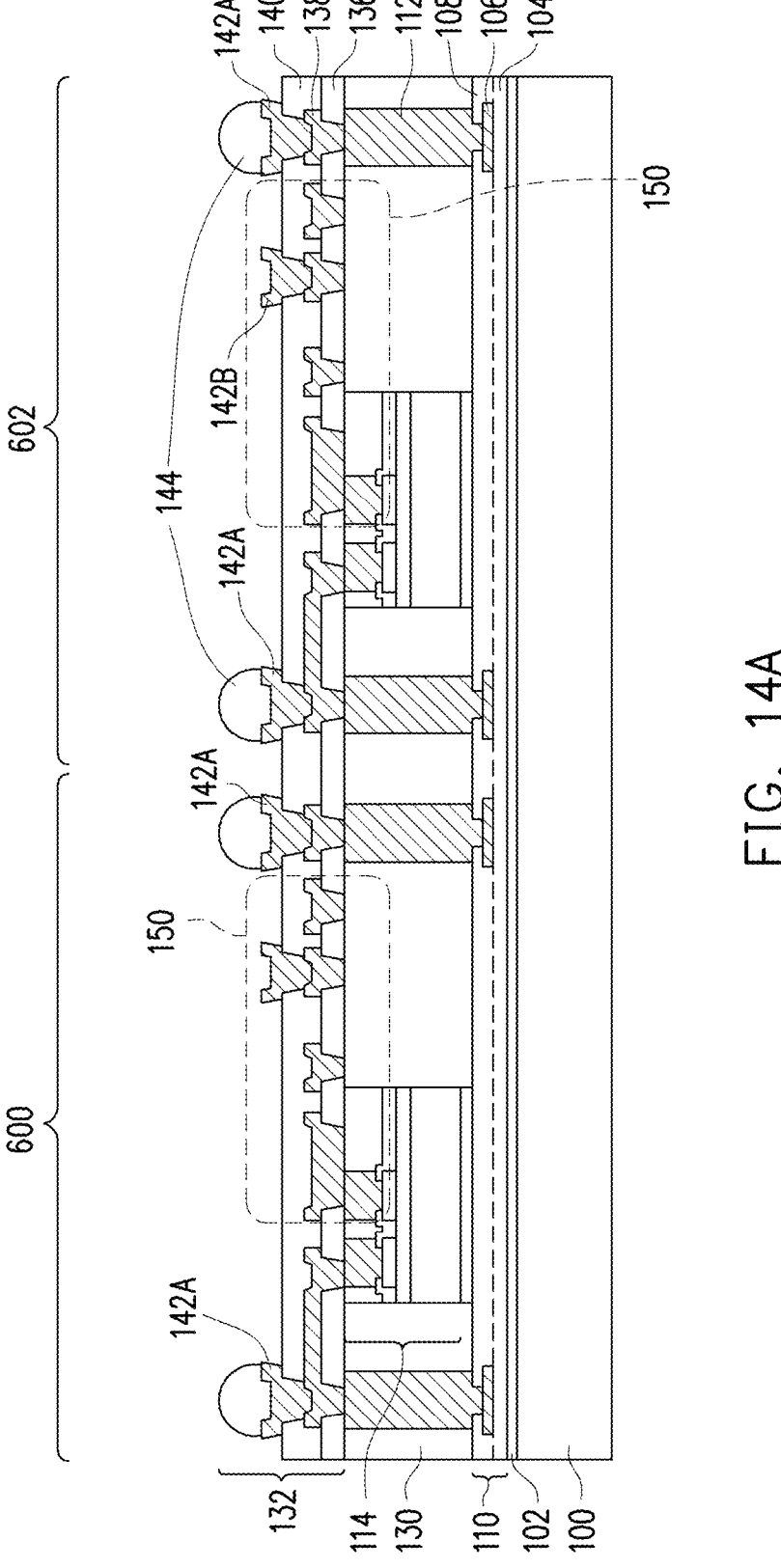

In FIG. 14A, conductive connectors 144 are formed on the UBMs 142A and are not formed on the component pads 142B. In some embodiments, the component pads 142B are covered by a mask (not shown) during the formation of the conductive connectors 144. The conductive connectors 144 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 144 may include a conductive material such as solder, copper, aluminum, gold, nickel, silver, palladium, tin, the like, or a combination thereof. In some embodiments, the conductive connectors 144 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 144 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 144. The metal cap layer may include nickel, tin, tin-lead, gold, silver, palladium, indium, nickel-palladium-gold, nickel-gold, the like, or a combination thereof and may be formed by a plating process.

Figure 15:
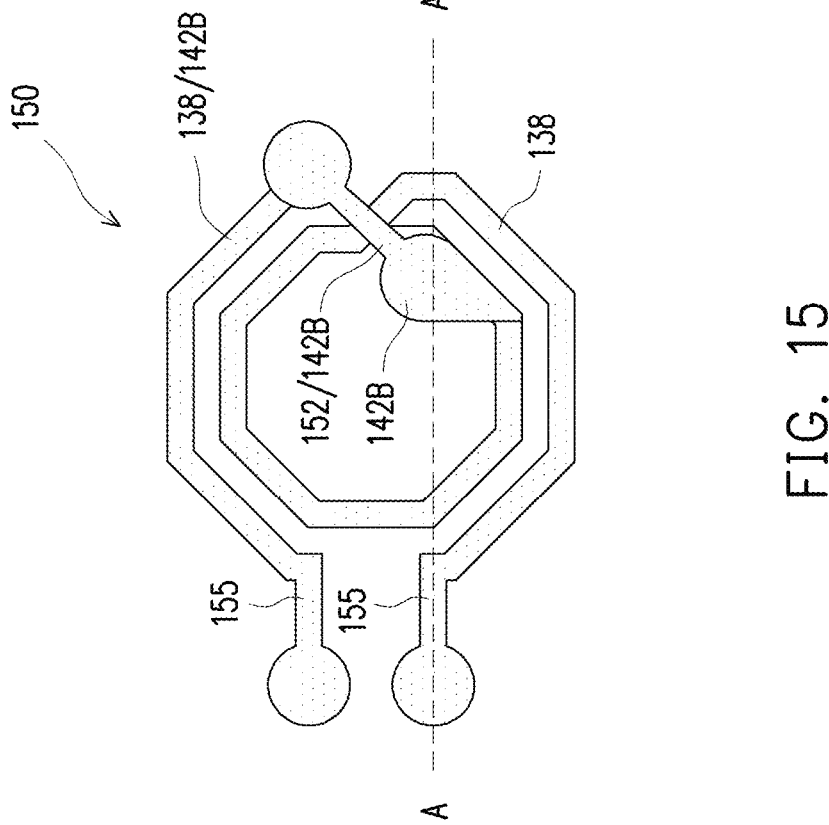

As shown in FIGS. 14A and 15, the front side redistribution structure 132 in each of the regions 600 and 602 includes at least one integrated component 150. In this embodiment, the integrated component 150 is an inductor. FIG. 15 is a plan view of an integrated component 150 in one of the regions 600 or 602 showing the integrated component 150 with the cross-sectional view in FIG. 14A is along the line A-A of FIG. 15. The integrated component 150 is formed of the metallization pattern and vias 138 and component pads 142B. The metallization patterns and vias 138 and component pads 142B form a plurality of concentric rings with the outer rings encircling the inner rings. The rings have breaks to allow the outer rings to be connected to the inner rings through bridges 152, and the plurality of rings (sometimes referred to as coils) is serially connected to two ports 155.

In the illustrated embodiment, the component pad 142B forms the bridge 152 over the metallization pattern and vias 138, although in other embodiments, this relationship can be reversed. The bridge 152 may be formed of on the upper portion of component pad 142B (line portion on top surface of dielectric layer 140) that does not include the via portion that extends through the dielectric layer 140.

FIGS. 14B-1, 14B-2, 14B-3, 14B-4, 14B-5, 14B-6, 14B-7, and 14-B8 illustrate example schematics of embodiments of a switch circuit including inductors/transformers being coupled to switches of the switch circuit. In an embodiment, the integrated circuit dies 114 include radio frequency device switches 157 that the inductors 150 are coupled to through the die connectors 126. The inductors 150 being integrated into the front side redistribution structure 132 can provide low cost and high-performance inductors 150 to improve performance of a radio frequency switch device 157. The improved performance of the radio frequency device switch 157 may include improved insertion loss and improved isolation. For example, inductors 150 are able to cancel the parasitic/coupling effect of CMOS devices. In addition, the conductive material of the inductors 150 are formed to include via trenches of the front side redistribution structure which allows for thicker conductors for the rings of the inductor, which then enables increase performance (e.g., higher Q factor) for the inductor.

Figures 2, 14B:
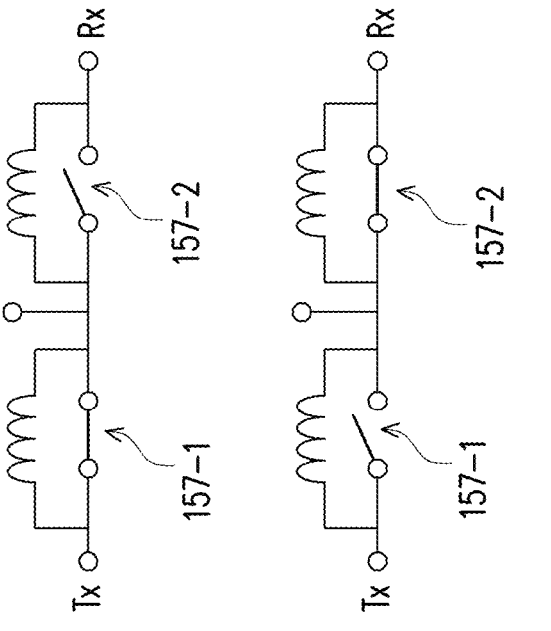
Figures 1, 14B:
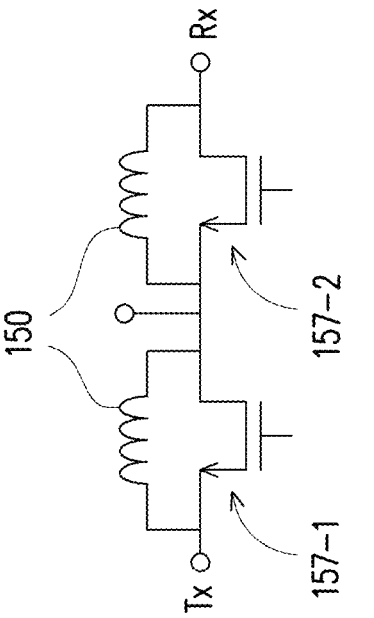
Figures 4, 14B:
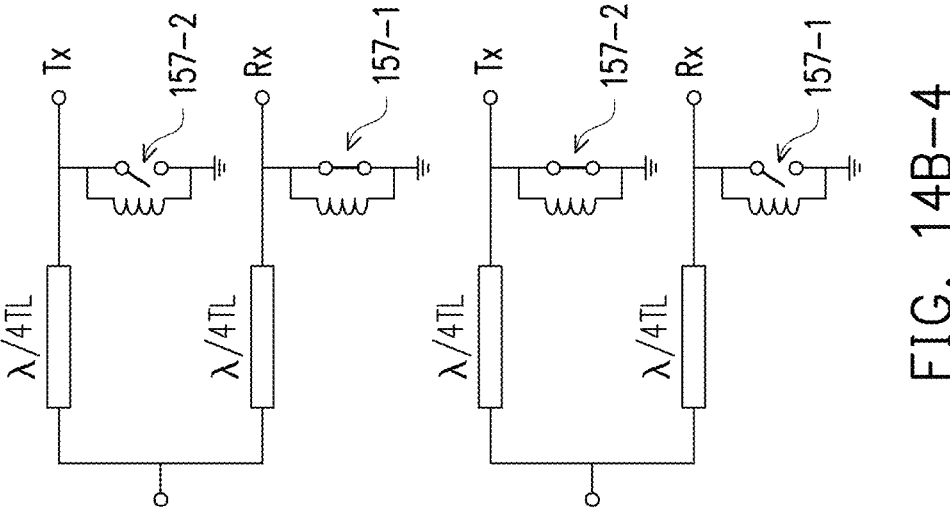
Figures 3, 14B:
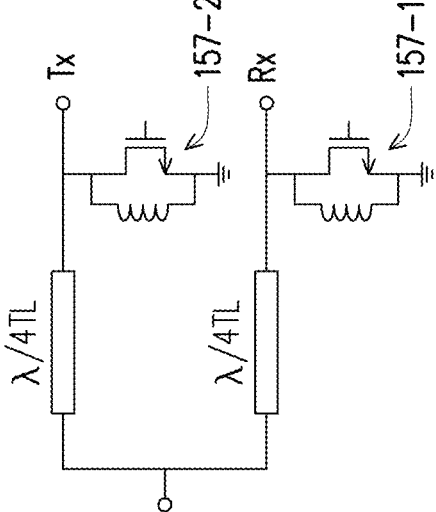
Figures 6, 14B:
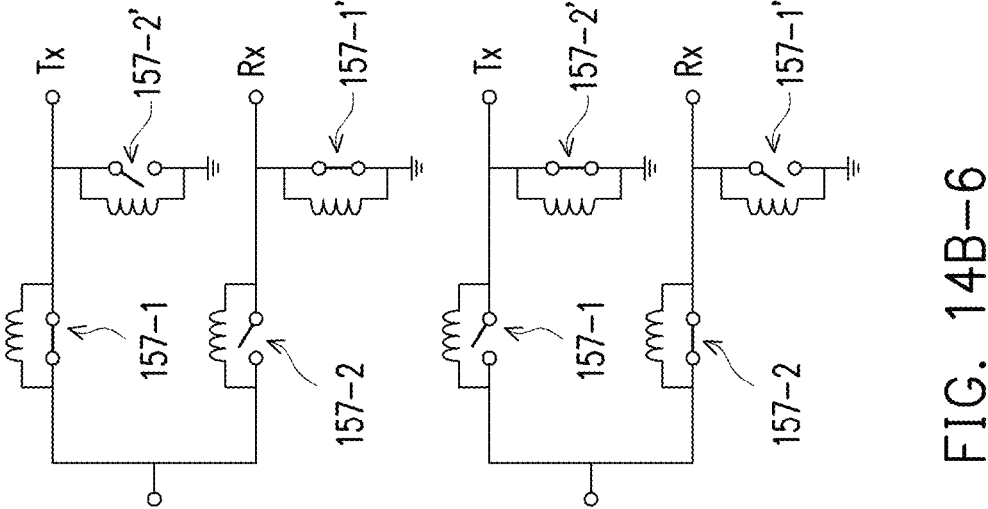
Figures 5, 14B:
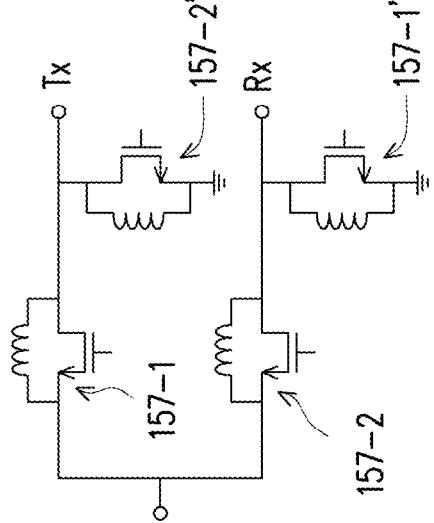
Figures 8, 14B:
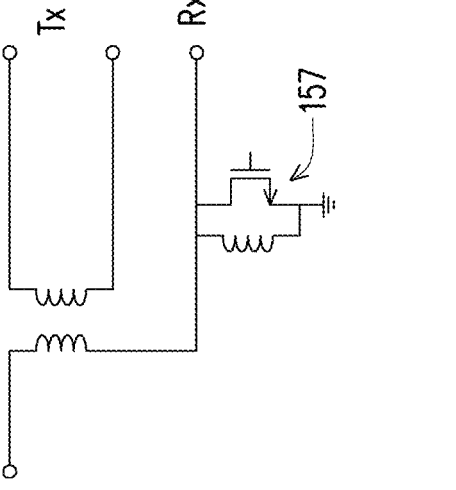
Figures 7, 14B:
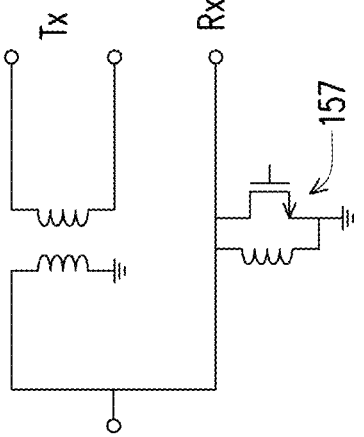

FIG. 14B-1 illustrates an example switch circuit and FIG. 14B-2 illustrates the operation of transmit (Tx) mode and receive (Rx) mode of the circuit in FIG. 14B-1 with the top circuit in FIG. 14B-1 illustrating Tx mode and the bottom circuit illustrating Rx mode.

FIG. 14B-3 illustrates an example switch circuit and FIG. 14B-4 illustrates the operation of Tx mode and Rx mode of the circuit in FIG. 14B-3 with the top circuit in FIG. 14B-4 illustrating Tx mode and the bottom circuit illustrating Rx mode.

FIG. 14B-5 illustrates an example switch circuit and FIG. 14B-6 illustrates the operation of Tx mode and Rx mode of the circuit in FIG. 14B-5 with the top circuit in FIG. 14B-6 illustrating Tx mode and the bottom circuit illustrating Rx mode.

For each of the circuits in FIGS. 14B-1, 14B-3, and 14B-5, in Tx mode, the transistor 157-1 is on and the transistor 157-2 is off. For these circuits in Rx mode, the transistor 157-1 is off and the transistor 157-2 is on. These configurations are shown in FIGS. 14B-2, 14B-4, and 14B-6.

Figure 8:
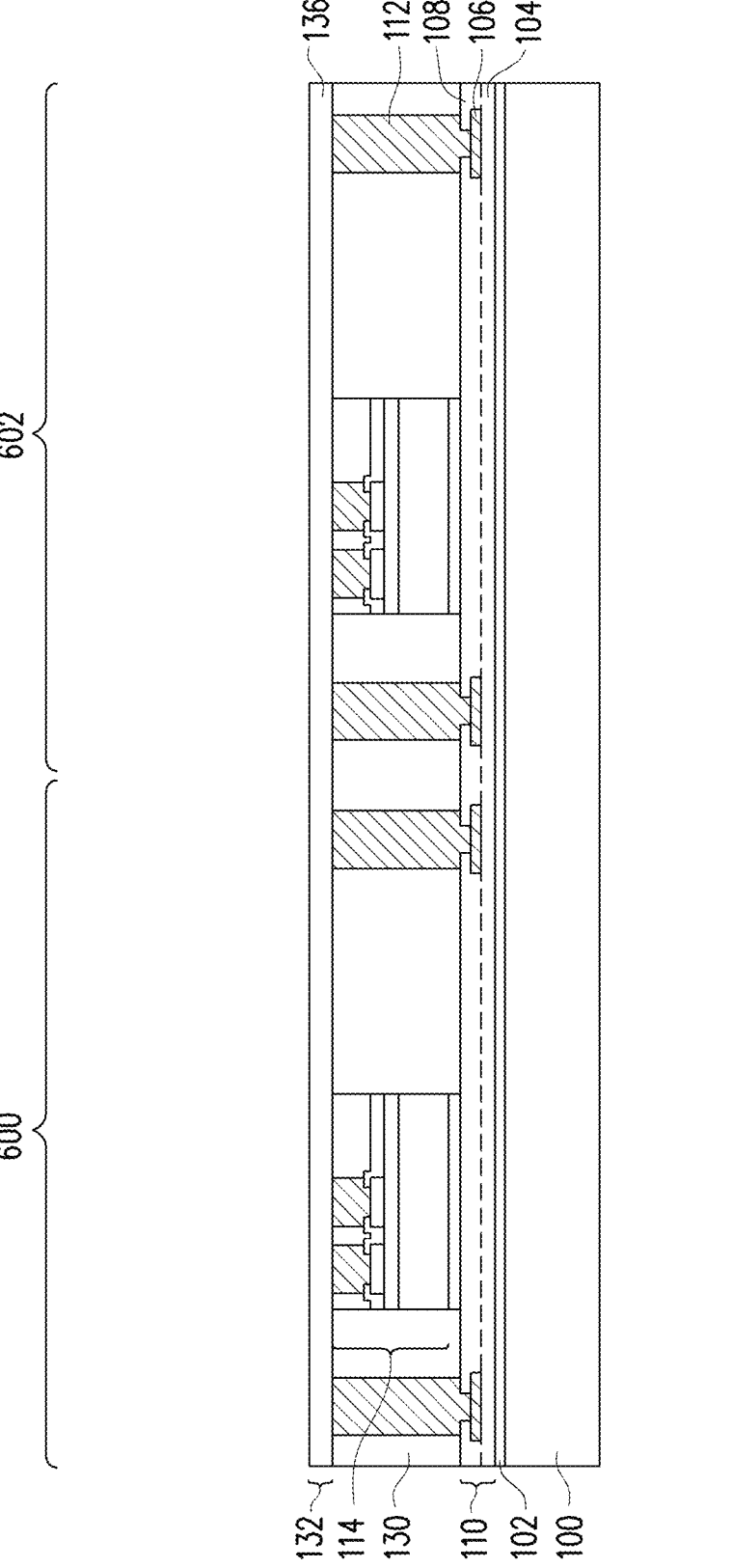

FIGS. 14B-7 and 14B-8 illustrates switch circuits with transformer configurations instead of inductor configurations of the prior examples. For FIGS. 14B-7 and 14B-8, in Tx mode, transistor 157 is on, and in Rx mode, transistor 157 is off.

Although FIGS. 14A to 14B-8 and 15 illustrates a 2-turn inductor (i.e., an inductor with two rings), it should be appreciated that inductors with more turns may be formed in the front side redistribution structure 132 of each region 600 and 602. For example, three or four turn inductors may be formed in each region 600 and 602.

Figure 16:
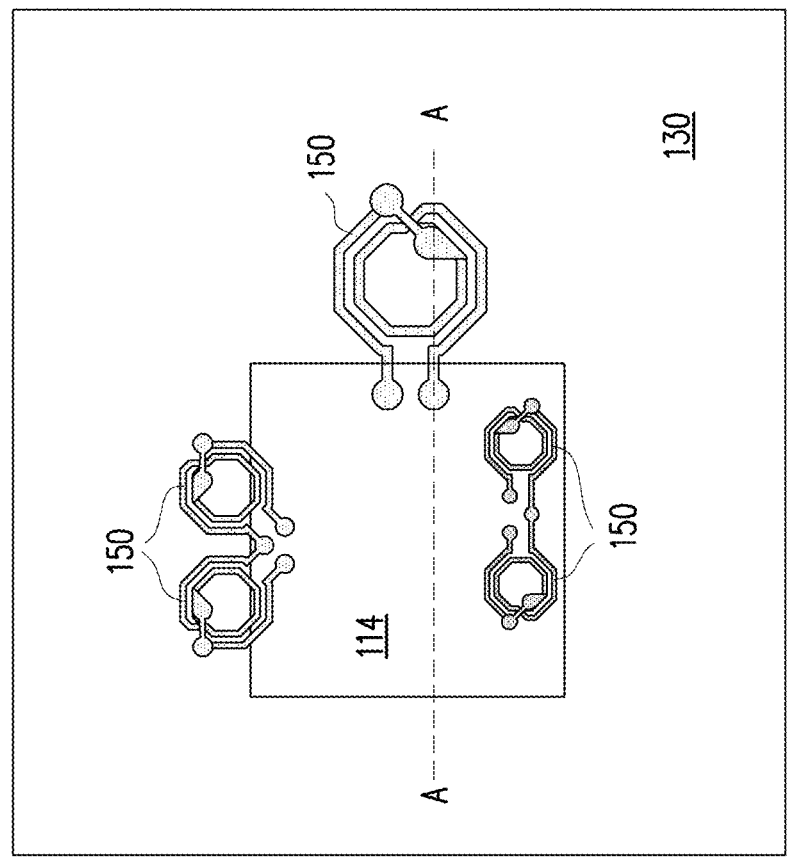

FIG. 16 is a plan view of one of the regions 600 or 602 showing multiple inductors 150 in the region. This plan view omits the dielectric layers of the front side redistribution structure 132 and also omits other metallization patterns in the front side redistribution structure 132. The cross-sectional view in FIG. 14A is along the line A-A of FIG. 16 with the plan view FIG. 16 only illustrating one integrated circuit die 114. Although FIG. 16 illustrates five inductors 150, in other embodiments, there could be more or less inductors 150 as needed for the design of the integrated circuit and/or package. In addition, in some embodiments, one or more of the components 150 could also be transformers (see, e.g., FIGS. 18A-1, 18A-2, 18B-1, 18B-2, 18B-3, and 18B-4).

Figure 17:
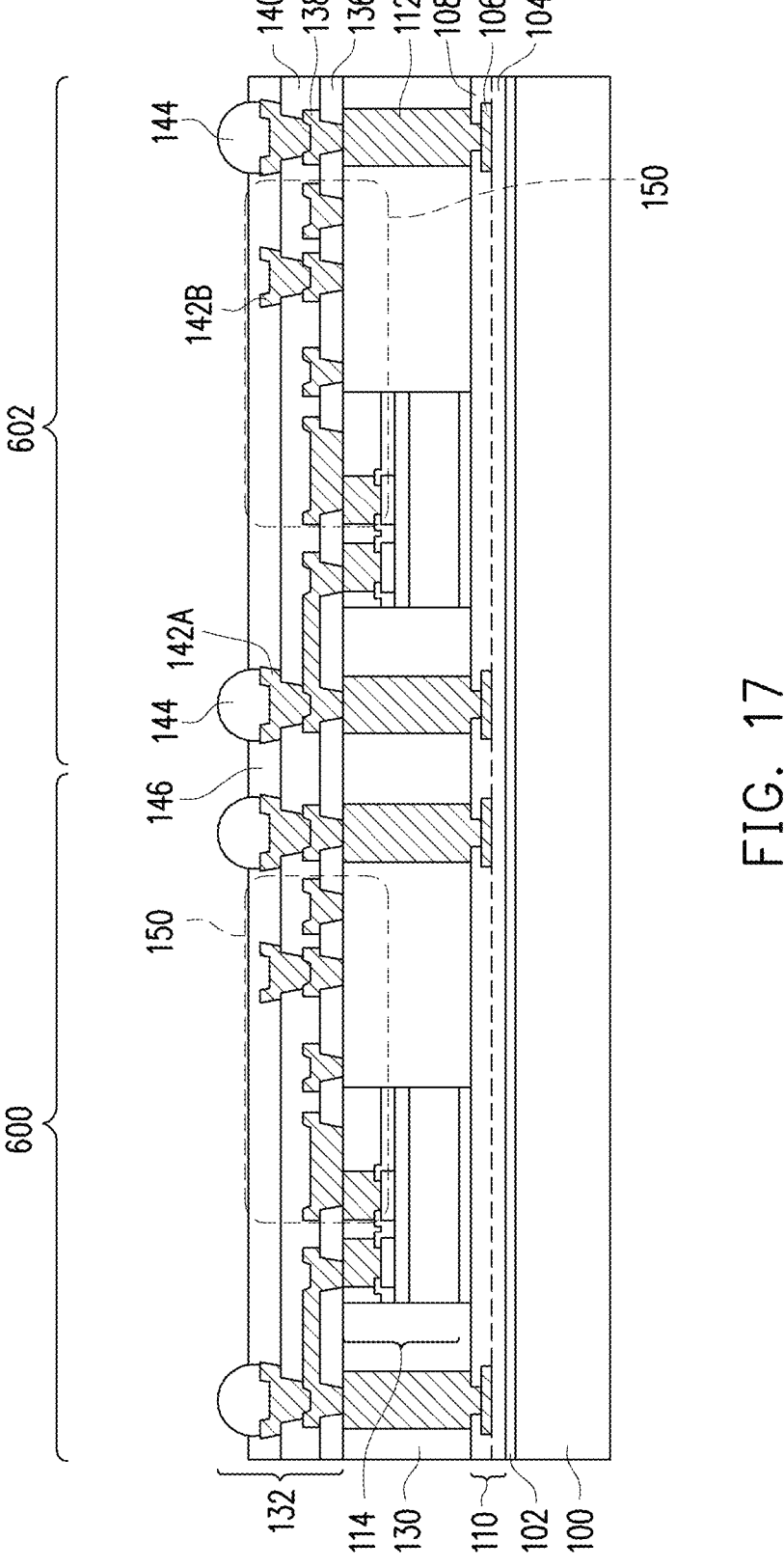

In FIG. 17, an insulating layer 146 (sometimes referred to as a protection layer 146) is formed over the front side redistribution structure 132, the UBMs 142A, the component pads 142B, and adjoining and surrounding the conductive connectors 144. The protection layer 146 may prevent oxidation of the component pads 142B and may provide lateral support for the conductive connectors 144 during subsequent reflow. In an embodiment, the protection layer 146 is a nonconductive material, such as an epoxy, a resin, a polyimide, polybenzoxazole (PBO), benzocyclobutene (BCB), a silicone, an acrylate, a polymer with or without a silica-based or glass filler added, the like, or a combination thereof. In some embodiments, the protection layer 146 comprises a liquid molding compound (LMC) that is a gel type liquid when applied. The protection layer 146 may be a liquid or solid when applied. Alternatively, the protection layer 146 may include other insulating and/or encapsulating materials. The protection layer 146 is applied using a wafer level molding process in some embodiments. The protection layer 146 may be formed to have a top surface over, substantially level with, or below an apex of the conductive connector 144. The protection layer 146 may be molded using, for example, compressive molding, transfer molding, or other methods.

Next, the protection layer 146 is cured using a curing process, in some embodiments. The curing process may comprise heating protection layer 146 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the protection layer 146 may be cured using other methods. In some embodiments, a curing process is not included.

In the embodiment where the protection layer 146 is not a polymer, the cost of protecting the integrated component 150 from oxidation is reduced as the other protection layer materials are cheaper than polymers.

Figures 1, 18A:
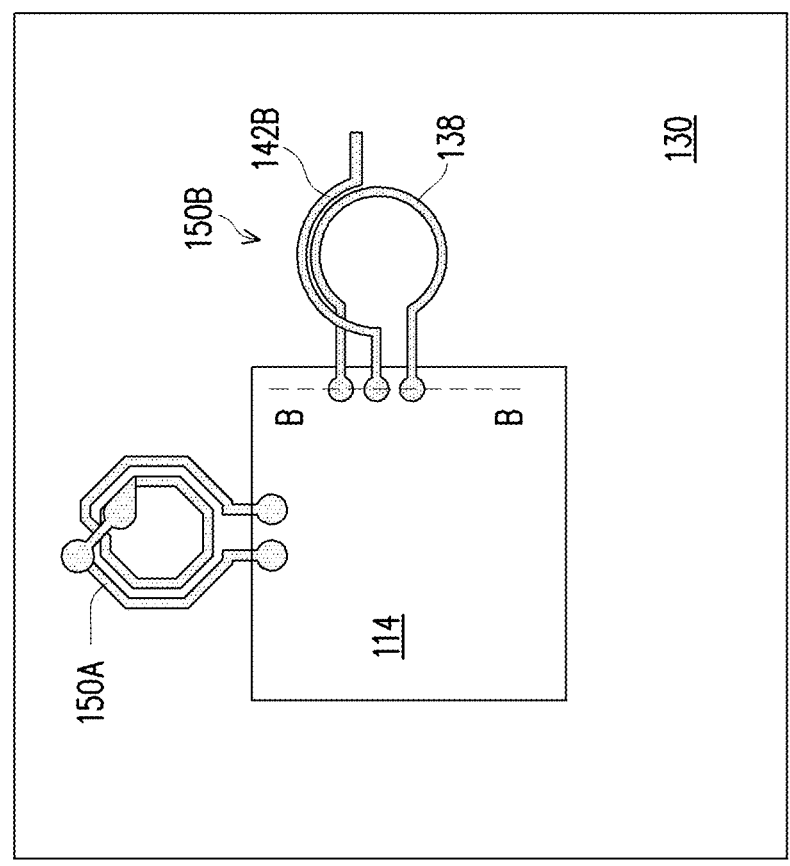
Figures 2, 18A:
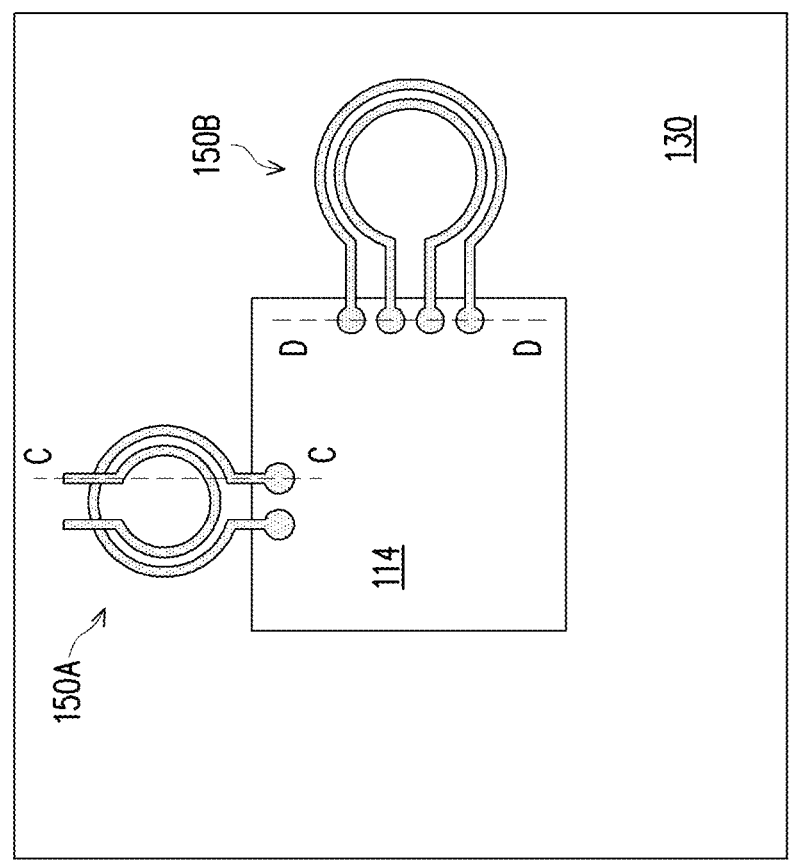
Figures 1, 18B:
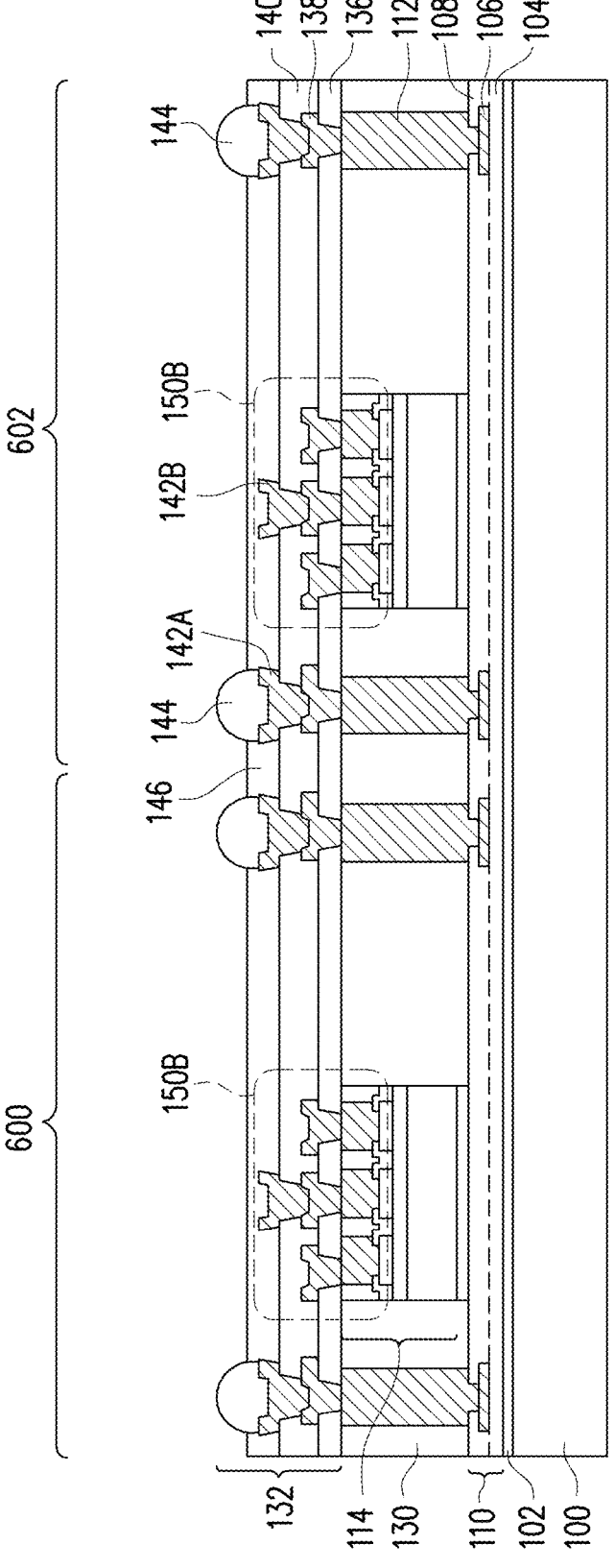
Figures 2, 18B:
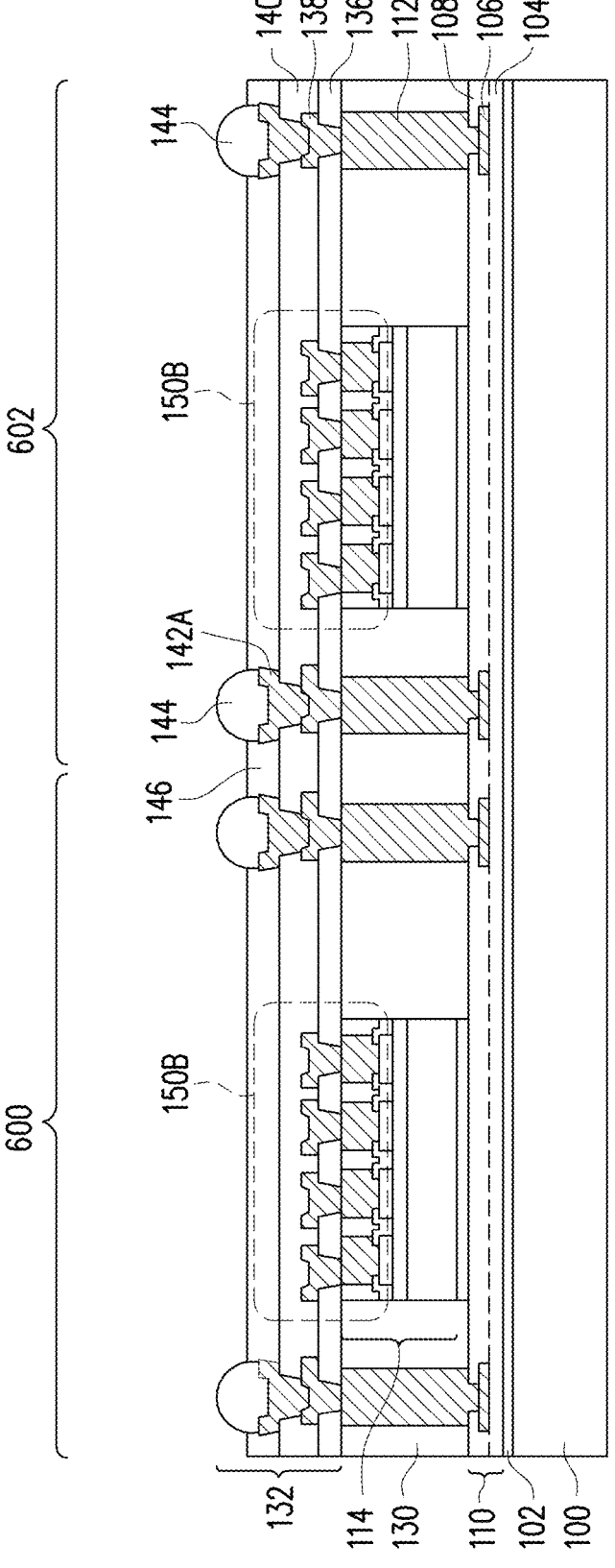
Figures 3, 18B:
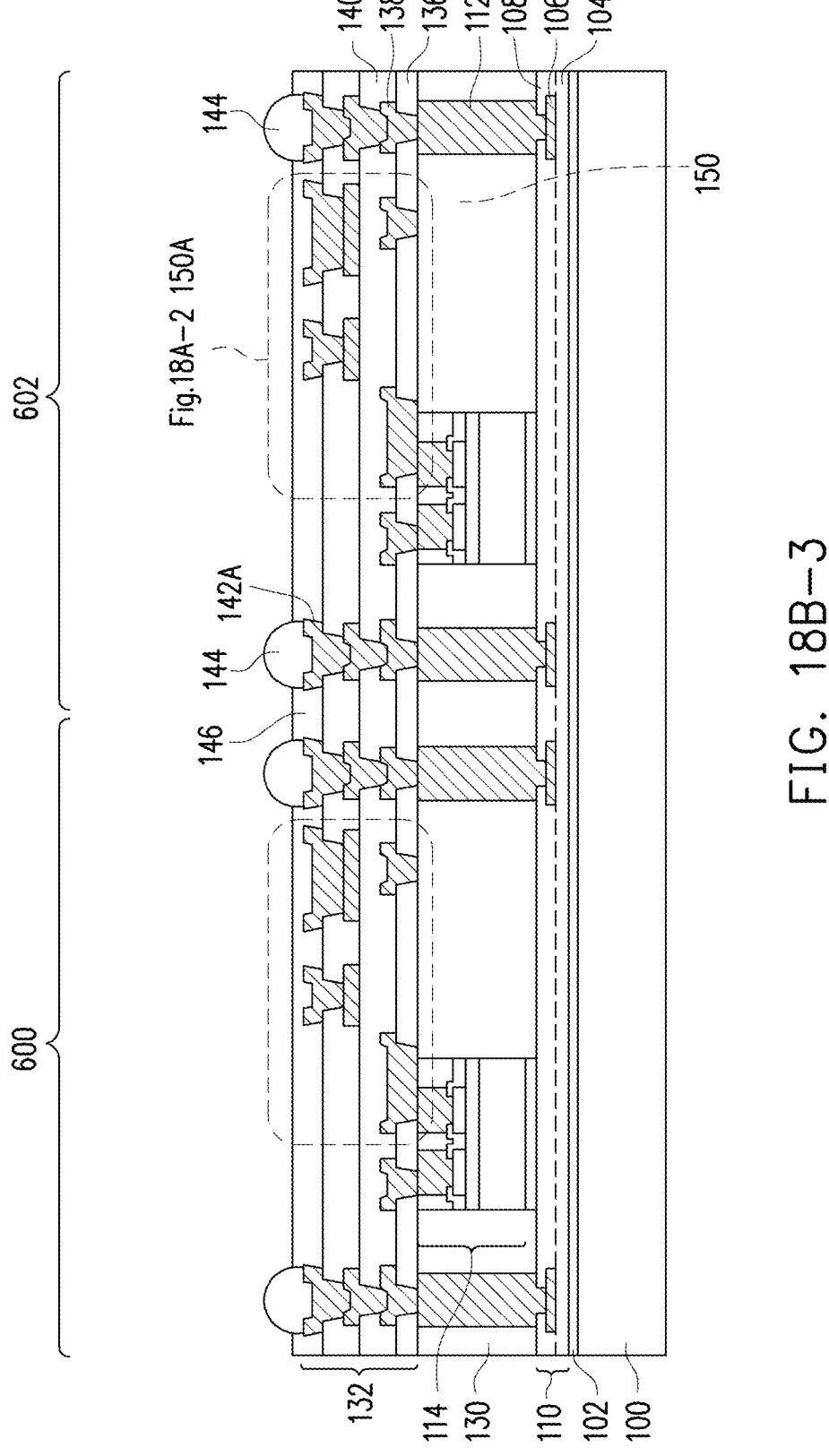
Figures 4, 18B:
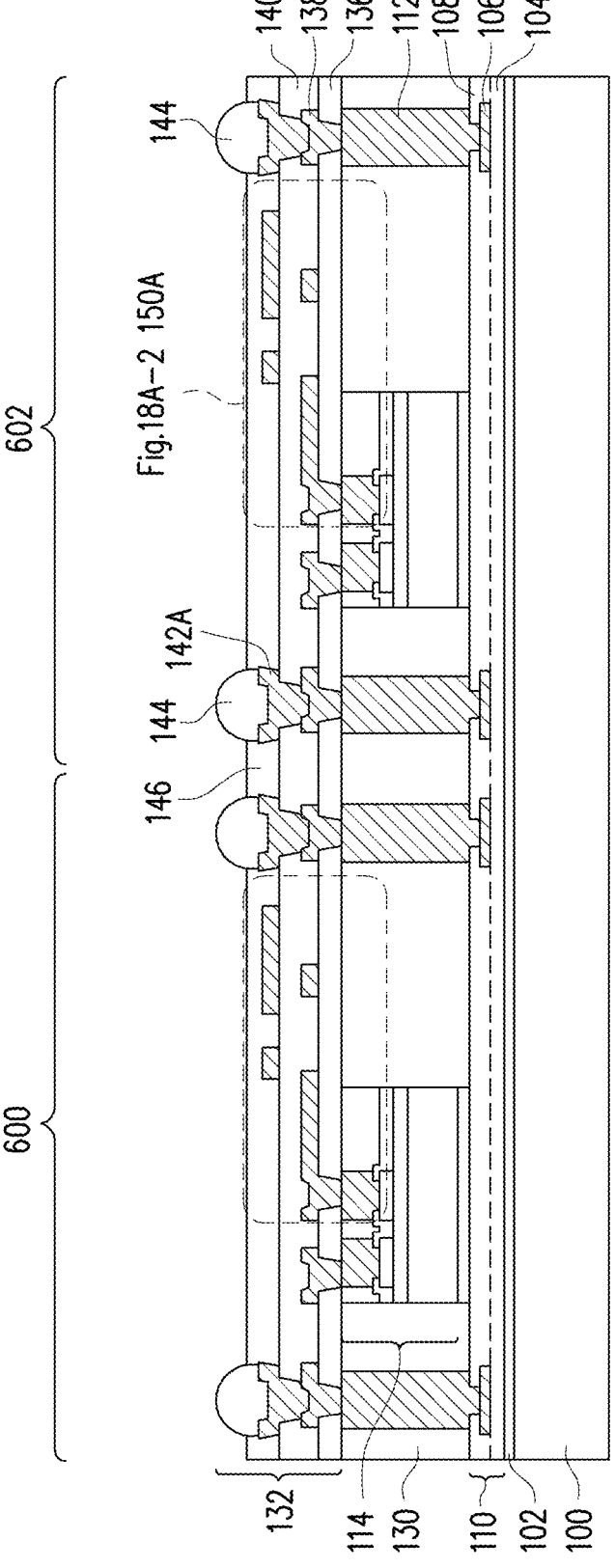

In some embodiments, the components 150 could include a transformer, an inductor, or both. FIG. 18A-1 is a plan view of one of the regions 600 or 602 showing multiple components 150 with one of the integrated components being an inductor 150A and the other component being a transformer 150B. This plan view omits the dielectric layers of the front side redistribution structure 132 and also omits other metallization patterns in the front side redistribution structure 132. The cross-sectional view in FIG. 18B-1 is along the line B-B of FIG. 18A-1. Although FIG. 18A-1 illustrates one inductor 150A and one transformer 150B, in other embodiments, there could be more or less inductors 150A and more or less transformers 150B as needed for the design of the integrated circuit and/or package.

FIG. 18A-2 is a plan view of one of the regions 600 or 602 showing multiple components 150 with both of the integrated components being transformers. This plan view omits the dielectric layers of the front side redistribution structure 132 and also omits other metallization patterns in the front side redistribution structure 132. The cross-sectional view in FIG. 18B-2 is along the line D-D of FIG. 18A-2. The cross-sectional views in FIGS. 18B-3 and 18B-4 are different configurations along the line C-C of FIG. 18A-2. Although FIG. 18A-2 illustrates a transformer 150A and one transformer 150B, in other embodiments, there could be more or less transformers and could include inductors as needed for the design of the integrated circuit and/or package.

FIGS. 18B-1, 18B-2, 18B-3, and 18B-4 illustrate intermediate stages of processing similar to that described in FIG. 17 above and the description of forming this intermediate stage of processing is not repeated herein. In these embodiments, the components 150A/150B are formed as transformers and/or inductors with the metallization patterns and the pads of the redistribution structure forming the coils of the transformers and/or inductors. The embodiment in FIG. 18B-3 includes more levels of metallization patterns and dielectric layers in the redistribution structure 132 than the other embodiments. Although the other embodiments could also include different numbers of layers than illustrated.

Any of the embodiments of the present disclosure may include a redistribution structure that includes one or more inductors, one or more transformers, or a combination thereof.

FIGS. 19 through 22 illustrate further operations and steps using the embodiment in FIG. 17 as an example, but these steps could also be performed on the embodiments of FIGS. 18B-1 to 18B-4.

Figure 19:
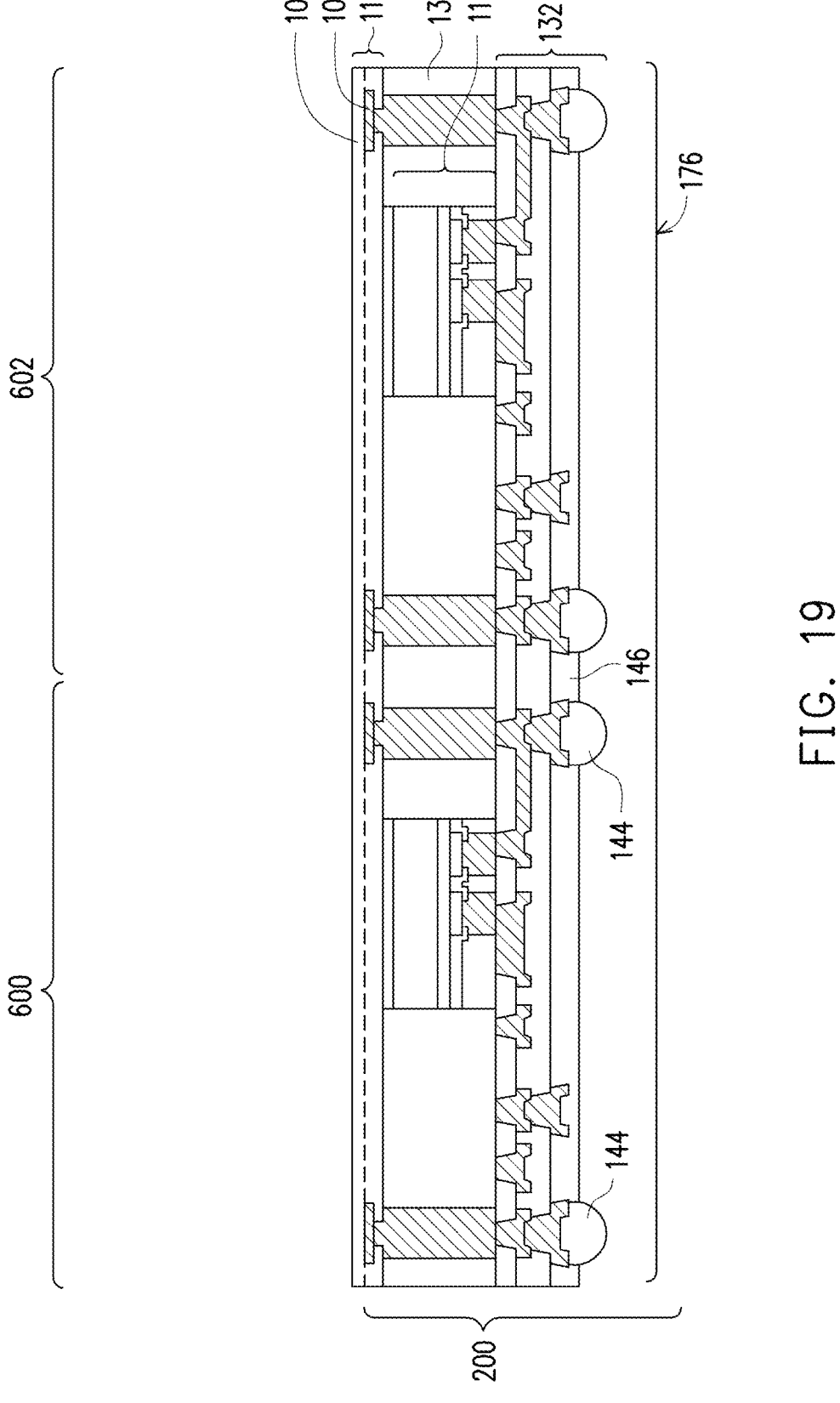

In FIG. 19, a carrier substrate de-bonding is performed to detach (de-bond) the carrier substrate 100 from the back side redistribution structure 110, e.g., the dielectric layer 104. The first packages 200 are thereby formed in each of the first package region 600 and the second package region 602. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 176.

Figure 20:
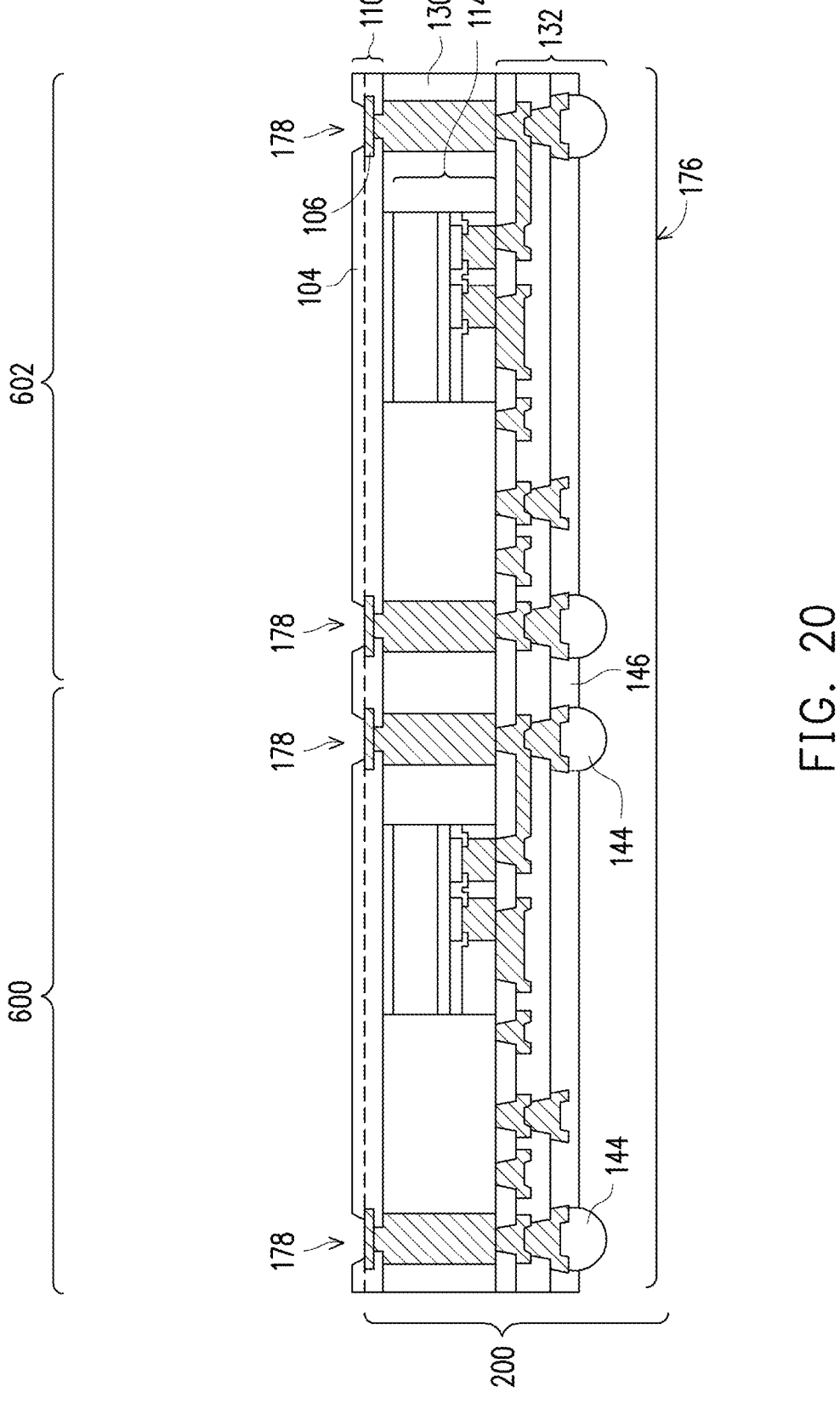

In FIG. 20, openings 178 are formed through the dielectric layer 104 to expose portions of the metallization pattern 106. The openings 178 may be formed, for example, using laser drilling, etching, or the like.

Figure 21:
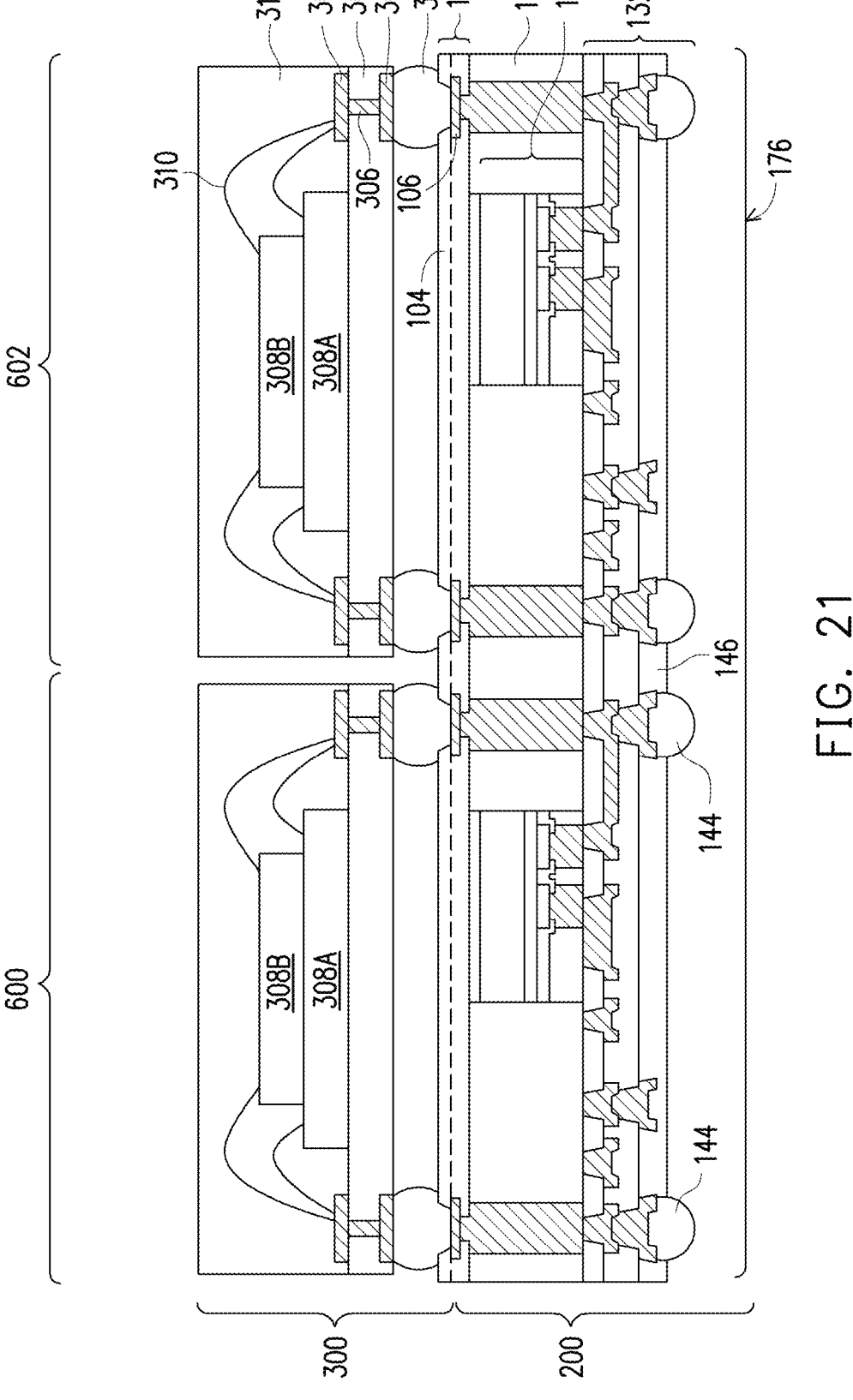
Figure 22:
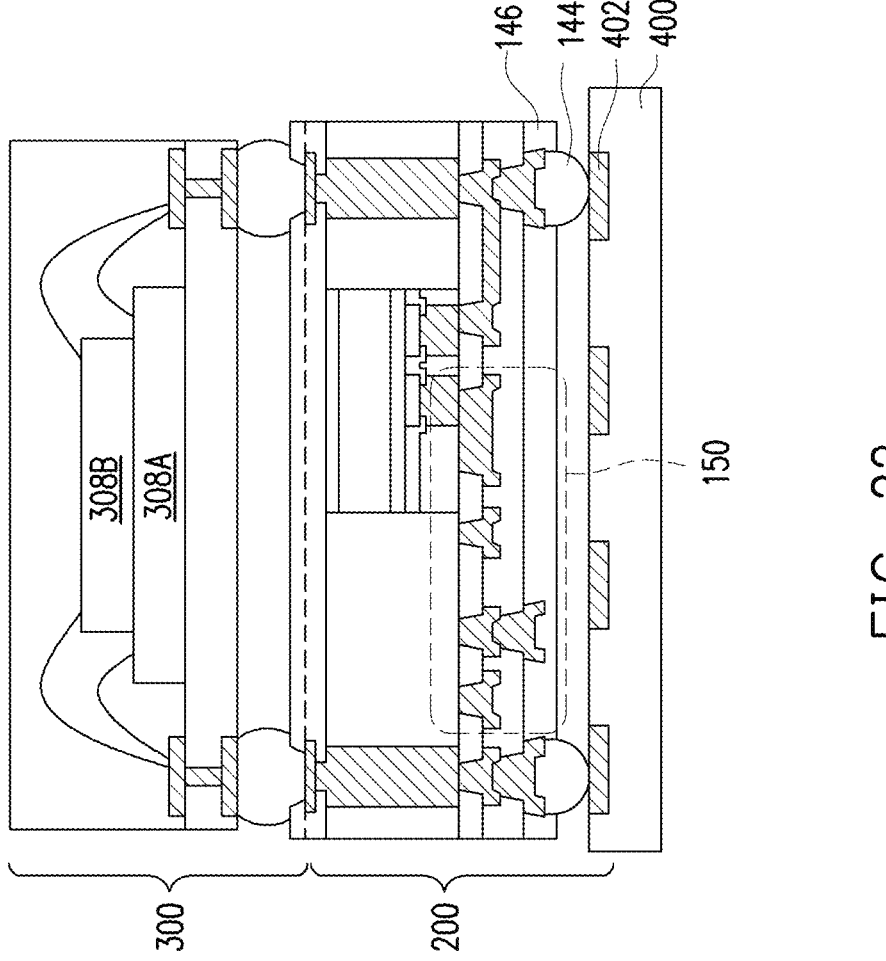

FIGS. 21 and 22 illustrate cross-sectional views of intermediate steps during a process for forming a package structure, in accordance with some embodiments. The package structure may be referred to a package-on-package (PoP) structure.

In FIG. 21, a second package 300 is attached to the first package 200. The second package 300 includes a substrate 302 and one or more stacked dies 308 (308A and 308B) coupled to the substrate 302. Although a singular stack of dies 308 (308A and 308B) is illustrated, in other embodiments, a plurality of stacked dies 308 (each having one or more stacked dies) may be disposed side by side coupled to a same surface of the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown). As one of ordinary skill in the art will recognize, a wide variety of devices such as transistors, capacitors, resistors, combinations of these, and the like may be used to generate the structural and functional requirements of the design for the second package 300. The devices may be formed using any suitable methods.

The substrate 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 303 on a first side the substrate 302 to couple to the stacked dies 308, and bond pads 304 on a second side of the substrate 302, the second side being opposite the first side of the substrate 302, to couple to the conductive connectors 314. In some embodiments, the bond pads 303 and 304 are formed by forming recesses (not shown) into dielectric layers (not shown) on the first and second sides of the substrate 302. The recesses may be formed to allow the bond pads 303 and 304 to be embedded into the dielectric layers. In other embodiments, the recesses are omitted as the bond pads 303 and 304 may be formed on the dielectric layer. In some embodiments, the bond pads 303 and 304 include a thin seed layer (not shown) made of copper, titanium, nickel, gold, palladium, the like, or a combination thereof. The conductive material of the bond pads 303 and 304 may be deposited over the thin seed layer. The conductive material may be formed by an electro-chemical plating process, an electroless plating process, CVD, ALD, PVD, the like, or a combination thereof. In an embodiment, the conductive material of the bond pads 303 and 304 is copper, tungsten, aluminum, silver, gold, the like, or a combination thereof.

In an embodiment, the bond pads 303 and 304 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the bond pads 303 and 304. Any suitable materials or layers of material that may be used for the bond pads 303 and 304 are fully intended to be included within the scope of the current application. In some embodiments, the through vias 306 extend through the substrate 302 and couple at least one bond pad 303 to at least one bond pad 304.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked dies 308 may be memory dies such as low-power (LP) double data rate (DDR) memory modules, such as LPDDR1, LPDDR2, LPDDR3, LPDDR4, or the like memory modules.

The stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing step may be performed to cure the molding material 312, wherein the curing may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second package 300.

After the second package 300 is formed, the second package 300 is mechanically and electrically bonded to the first package 200 by way of conductive connectors 314, the bond pads 304, and the metallization pattern 106. In some embodiments, the stacked dies 308 may be coupled to the integrated circuit dies 114 through the wire bonds 310, the bond pads 303 and 304, through vias 306, the conductive connectors 314, and the through vias 112.

The conductive connectors 314 may be similar to the conductive connectors 144 described above and the description is not repeated herein, although the conductive connectors 314 and the conductive connectors 144 need not be the same. The conductive connectors 314 may be disposed on an opposing side of the substrate 302 as the stacked dies 308, in the openings 178. In some embodiments, a solder resist (not separately labeled) may also be formed on the side of the substrate opposing the stacked dies 308. The conductive connectors 314 may be disposed in openings in the solder resist to be electrically and mechanically coupled to conductive features (e.g., the bond pads 304) in the substrate 302. The solder resist may be used to protect areas of the substrate 302 from external damage.

In some embodiments, before bonding the conductive connectors 314, the conductive connectors 314 are coated with a flux (not shown), such as a no-clean flux. The conductive connectors 314 may be dipped in the flux or the flux may be jetted onto the conductive connectors 314. In another embodiment, the flux may be applied to the surfaces of the metallization pattern 106.

In some embodiments, the conductive connectors 314 may have an optional epoxy flux (not shown) formed thereon before they are reflowed with at least some of the epoxy portion of the epoxy flux remaining after the second package 300 is attached to the first package 200.

An underfill (not shown) may be formed between the first package 200 and the second package 300 and surrounding the conductive connectors 314. The underfill may reduce stress and protect the joints resulting from the reflowing of the conductive connectors 314. The underfill may be formed by a capillary flow process after the first package 200 is attached or may be formed by a suitable deposition method before the first package 200 is attached. In embodiments where the epoxy flux is formed, it may act as the underfill.

The bonding between the second package 300 and the first package 200 may be a solder bonding. In an embodiment, the second package 300 is bonded to the first package 200 by a reflow process. During this reflow process, the conductive connectors 314 are in contact with the bond pads 304 and the metallization pattern 106 to physically and electrically couple the second package 300 to the first package 200. After the bonding process, an intermetallic compound (IMC, not shown) may form at the interface of the metallization pattern 106 and the conductive connectors 314 and also at the interface between the conductive connectors 314 and the bond pads 304 (not shown).

A singulation process is performed by sawing along scribe line regions, e.g., between the first package region 600 and the second package region 602. The sawing singulates the first package region 600 from the second package region 602. The resulting, singulated first and second packages 200 and 300 are from one of the first package region 600 or the second package region 602. In some embodiments, the singulation process is performed after the second package 300 is attached to the first package 200. In other embodiments (not shown), the singulation process is performed before the second package 300 is attached to the first package 200, such as after the carrier substrate 100 is de-bonded and the openings 178 are formed.

In FIG. 22, the first package 200 is mounted to a package substrate 400 using the conductive connectors 144. The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown). As one of ordinary skill in the art will recognize, a wide variety of devices such as transistors, capacitors, resistors, combinations of these, and the like may be used to generate the structural and functional requirements of the design for the package structure. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 144 are reflowed to attach the first package 200 to the bond pads 402. The conductive connectors 144 electrically and/or physically couple the package substrate 400, including metallization layers in the package substrate 400, to the first package 200. In some embodiments, passive devices (e.g., surface mount devices (SMDs), not illustrated) may be attached to the first package 200 (e.g., bonded to the bond pads 402) prior to mounting on the package substrate 400. In such embodiments, the passive devices may be bonded to a same surface of the first package 200 as the conductive connectors 144.

The conductive connectors 144 may have an epoxy flux (not shown) formed thereon before they are reflowed with at least some of the epoxy portion of the epoxy flux remaining after the first package 200 is attached to the package substrate 400. This remaining epoxy portion may act as an underfill to reduce stress and protect the joints resulting from the reflowing the conductive connectors 144. In some embodiments, an underfill (not shown) may be formed between the first package 200 and the package substrate 400 and surrounding the conductive connectors 144. The underfill may be formed by a capillary flow process after the first package 200 is attached or may be formed by a suitable deposition method before the first package 200 is attached.

FIGS. 23 through 26 illustrate cross-sectional views of another package structure in accordance with some embodiments. The embodiment in FIGS. 23 through 26 is similar to the embodiment illustrated in FIGS. 1 through 22 except that this embodiment includes integrated antennas, the integrated antennas include a patch antenna and an optional radiating antenna. The patch antenna includes one or more signal lines (also referred to herein as feed lines), a ground element, and one or more radiating elements. Details regarding this embodiment that are similar to those for the previously described embodiment will not be repeated herein.

Figure 23:
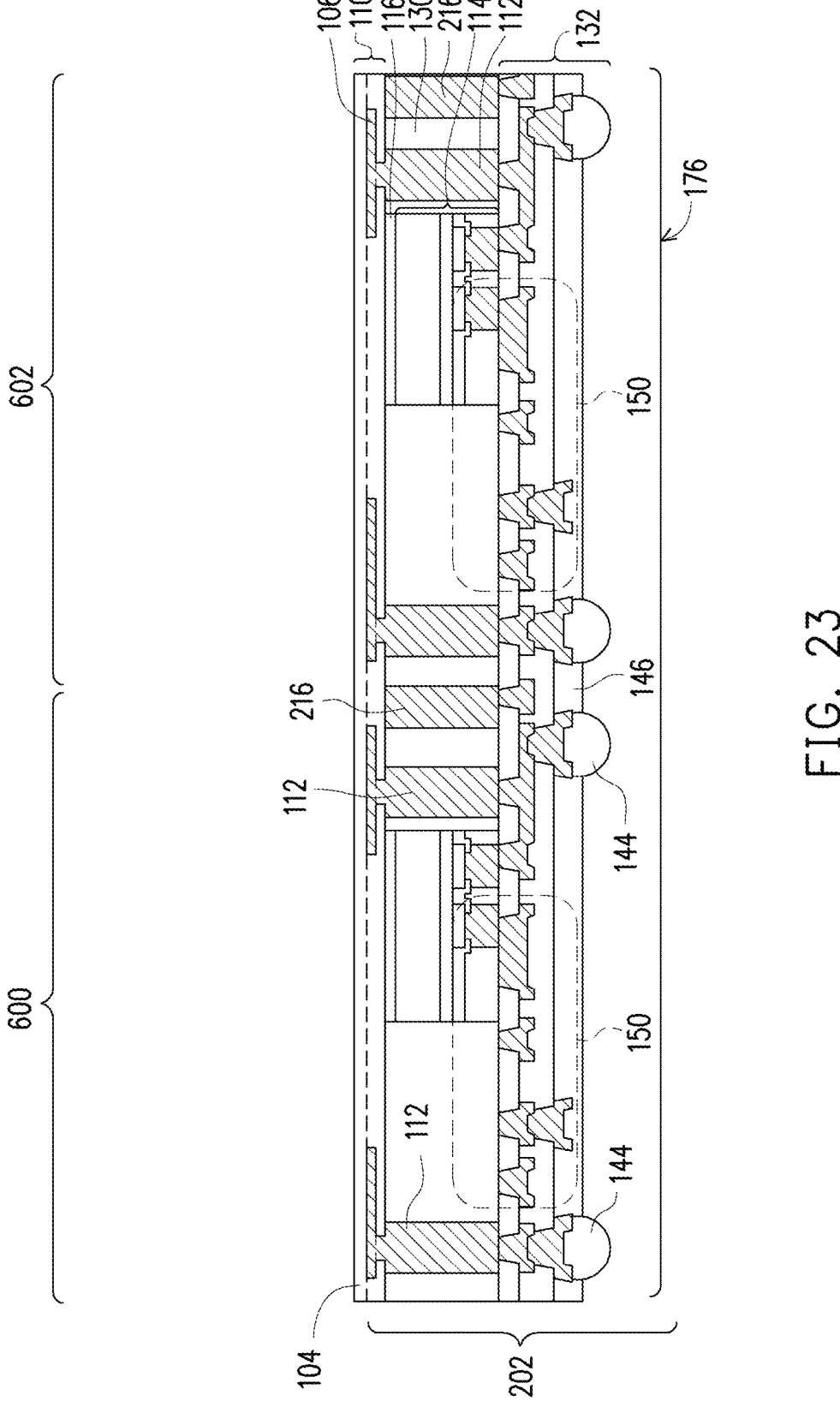
FIGS. 23, 24, 25, and 26 illustrate cross-sectional views of intermediate steps during a process for forming a package structure in accordance with some embodiments.

FIG. 23 illustrates an intermediate stage of processing similar to that described in FIG. 19 above and the description of forming this intermediate stage of processing is not repeated herein. In FIG. 23, the back side redistribution structure 110 includes metallization patterns 106 that can be ground elements and feed lines for the patch antenna. In addition, the dielectric layer 104 on the back side redistribution structure may be omitted and/or removed in this embodiment.

In some embodiments, the package structure 202 in each region 600 and 602 includes a radiating antenna 216 that extends through the encapsulant 130. In some embodiments, the radiating antenna 216 is a dipole antenna. The radiating antenna 216 is includes conductive features that extend through the encapsulant 130. These conductive features may be formed at the same time and by a same process as the electrical connectors 112. The radiating antennas 216 are electrically connected to the respective integrated circuit die 114 by metallization patterns in the front side redistribution structure 132. A shape and configuration of the radiating antennas is selected to enable the sending and receiving of wireless signals to and from other devices (not illustrated) outside of package 202. In other embodiments, the radiating antennas may be omitted.

Figure 24:
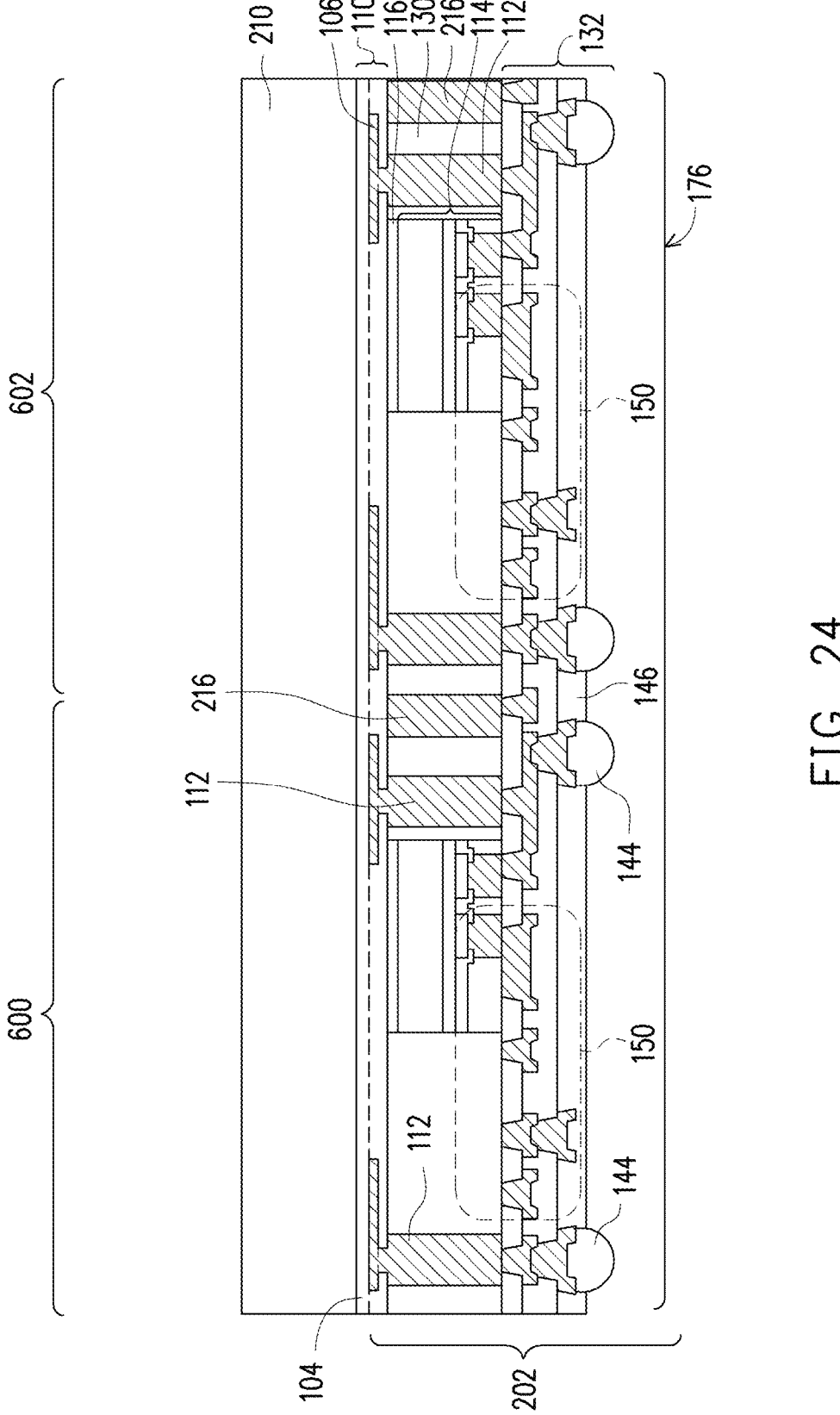

FIG. 24 illustrates further processing on the structure of FIG. 23. In FIG. 24, a dielectric layer 210 is formed over the dielectric layer 104 (if present). In some embodiments, the dielectric layer 210 comprises a relatively low dissipation factor (DF) material in order to achieve a suitably efficient patch antenna. For example, a DF of the dielectric layer 210 may be less than about 0.01 or even less than about 0.001 in some embodiments. Furthermore, a k-value of the dielectric layer 210 may in the range from about 3 to about 4. In an embodiment, the thickness of the dielectric layer 210 is related to the operating frequency of the patch antenna 214 (see FIG. 25). For example, the thickness of the dielectric layer 210 may be inversely proportional to an operating frequency of the patch antenna 214. In an embodiment, a thickness of the dielectric layer 210 may be in the range of about 200 μm to about 300 μm when the patch antenna 214 has an operating frequency of at least 60 GHz. The dielectric layer 210 may be formed using any suitable process, such as, lamination. Other deposition processes (e.g., PVD, CVD, a spin-on technique, etc.) may also be used in other embodiments. In the embodiments including the radiating antennas 216, the encapsulant 130 may also be formed from a low DF material.

Figure 25:
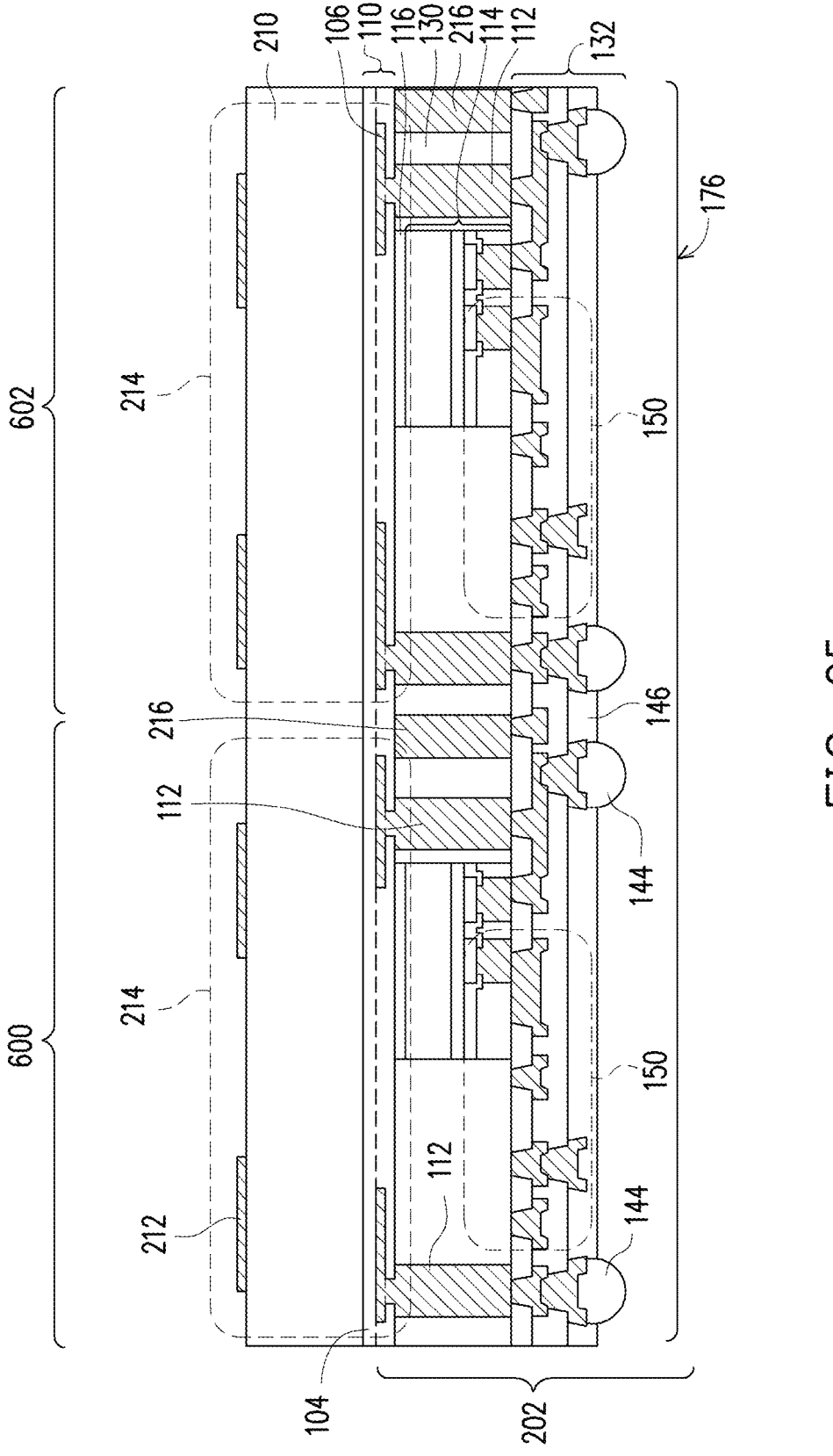

In FIG. 25, radiating elements 212 of a patch antenna 214 are formed over the dielectric layer 210. In a top down view, the radiating elements 212 may have a rectangular shape and overlap the ground elements and feed lines 106 although other shapes are contemplated in other embodiments. The radiating elements 212 may comprise any suitable conductive material, such as, copper, although other conductive materials may be used in other embodiments. Radiating elements 212 may be adhered on a surface of the dielectric layer 210 by an adhesive (not shown). In some embodiments, the adhesive may be an epoxy, which is applied to the radiating elements 212 prior to adhesion on the dielectric layer 210. The radiating elements 212 may then be placed on the dielectric layer 210 (e.g., by a pick and place tool), and the adhesive may be activated (e.g., by heating) to adhere the radiating elements 212 on the dielectric layer 210. In other embodiments, the adhesive is excluded and the radiating elements 212 are directly adhered to the dielectric layer 210. In other embodiments, the radiating elements 212 are formed on the dielectric layer 210 using a different method, such as, by depositing a seed layer, forming a patterned mask over the seed layer to define a pattern of the radiating elements 212, plating the radiating elements in openings of the patterned mask, and removing the patterned mask and excess portions of the seed layer. Other deposition processes are also possible for the radiating elements 212.

The radiating elements 212 are electrically coupled to the underlying ground element and feed lines 106 for the transmission and reception of wireless signals. Thus, patch antennas 214 (comprising the ground elements and feed lines 106, portions of the dielectric layer 210, and radiating elements 212) are formed. Each of the patch antennas 214 are integrated in a same semiconductor package as an integrated circuit dies 114 and the inductors 150. A dielectric feature 116/108 physically separates and helps isolate each of the integrated circuit dies 114 from a respective patch antenna 214 in order to increase the efficiency of the patch antenna 214.

Figure 26:
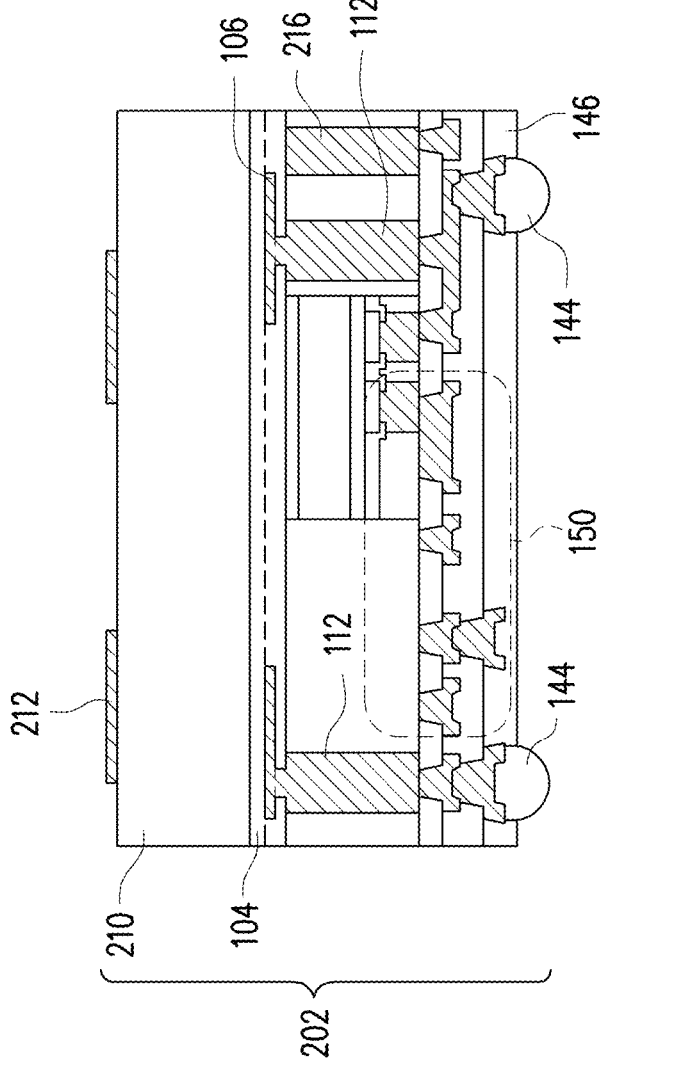

In FIG. 26, a singulation process is performed by sawing along scribe line regions, e.g., between the first package region 600 and the second package region 602. The sawing singulates the first package region 600 from the second package region 602. The resulting, singulated package 202 is from one of the first package region 600 or the second package region 602.

After FIG. 26, the package 202 may be further processed, such as, mounted to a package substrate 400 as described above in the previous embodiment in FIG. 22 and the description is not repeated herein.

Figure 27:
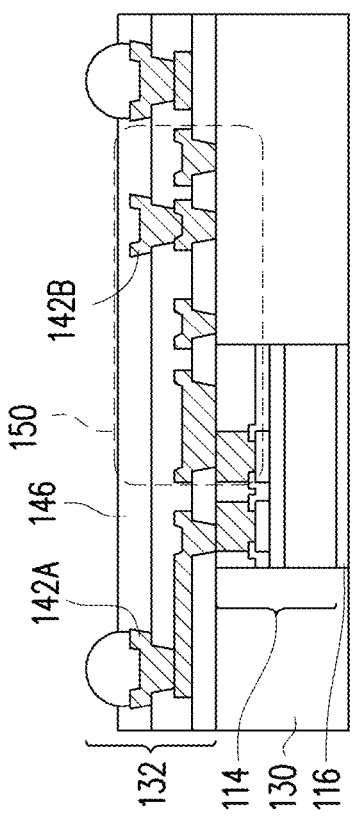
FIG. 27 illustrates a cross-sectional view of an intermediate step during a process for forming a package structure in accordance with some embodiments.

FIG. 27 illustrates a cross-sectional view of a singulated package structure in accordance with some embodiments. This embodiment is similar to the embodiment illustrated in FIGS. 1 through 22 except that this embodiment omits the electrical connectors 112 and may not include the second package 300. Details regarding this embodiment that are similar to those for the previously described embodiment will not be repeated herein.

This embodiment may be formed by similar processing described in FIGS. 1 through 18B-4 (except for omitting the electrical connectors 112 and the back side redistribution structure 110) and the description is not repeated herein. The package structure may be similarly formed at the wafer scale and then singulated after the protection layer 146 is formed.

Figure 28:
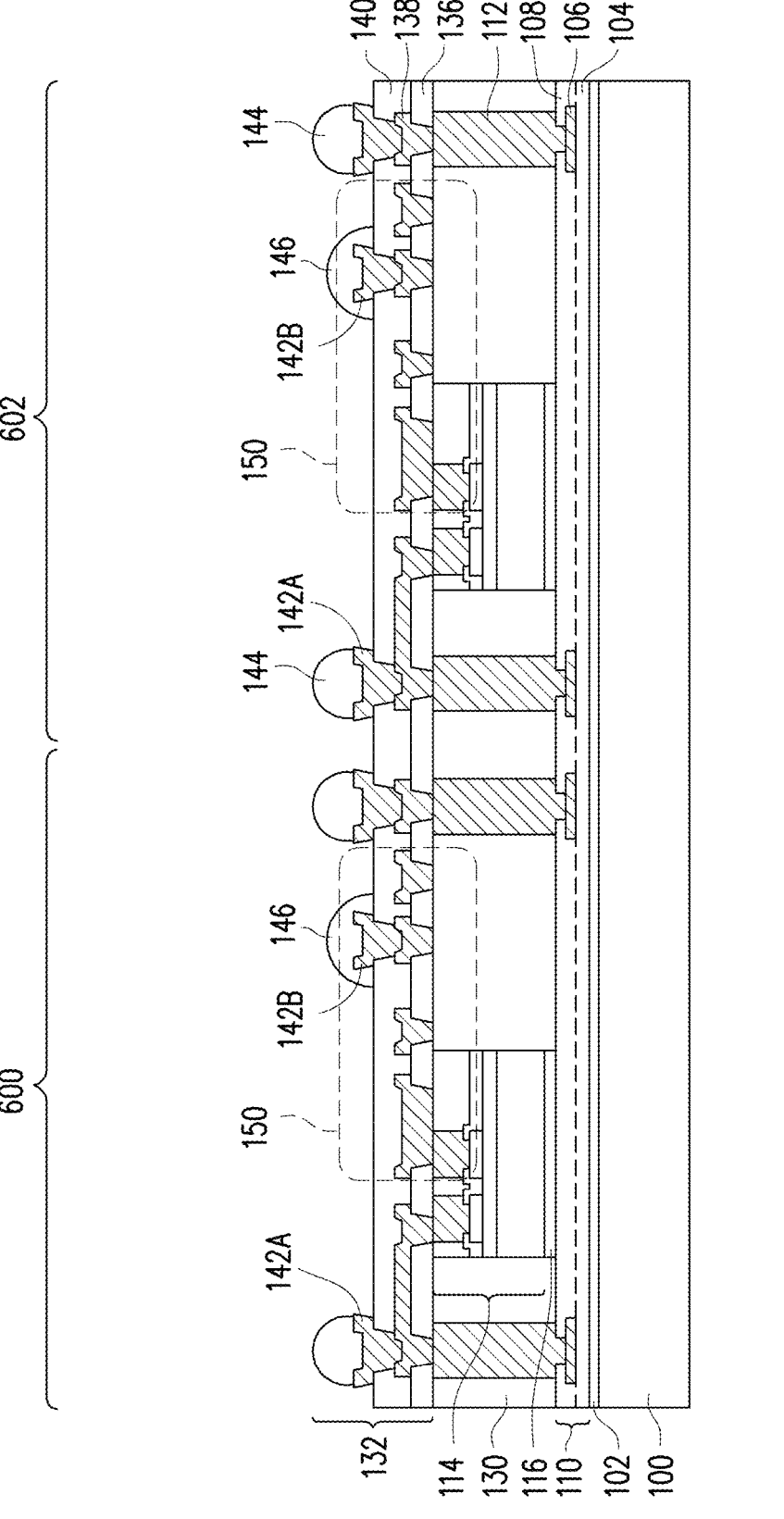
FIG. 28 illustrates a cross-sectional view of an intermediate step during a process for forming a package structure in accordance with some embodiments.

FIG. 28 illustrates a cross-sectional view of another package structure in accordance with some embodiments. This embodiment is similar to the embodiment illustrated in FIGS. 1 through 22 except that this embodiment only partially covers the wafer scale structure with the protection layer 146. By only covering the component pad 142B with the protection layer 146, the cost of the package structure can be reduced. Details regarding this embodiment that are similar to those for the previously described embodiment will not be repeated herein.

FIG. 28 illustrates an intermediate stage of processing similar to that described in FIG. 16 above and the description of forming this intermediate stage of processing is not repeated herein. In FIG. 28, the protection layer 146 is only formed to cover the component pad 142B and does not cover the entire front side redistribution structure 132. This embodiment still provides oxidation protection for the integrated component 150 and also saves costs as compared to the embodiment of FIGS. 1 through 22.

After FIG. 28, the package structure may be further processed as described above in reference FIGS. 19 through 22 and the description is not repeated herein.

FIGS. 29 through 34 illustrate cross-sectional views of another package structure in accordance with some embodiments. The embodiment in FIGS. 29 through 34 is similar to the embodiment illustrated in FIG. 28 except that this embodiment includes openings 158 (e.g., air gaps) in the dielectric material of the front side redistribution structure 132 adjacent of the integrated component 150. These openings 158 in dielectric material adjacent the integrated component 150 may reduce the inductor's parasitic capacitance. The embodiments including the openings/air gaps can improve the Q factor of the integrated component 150 and can also raise the self resonate frequency of the integrated component 150. Details regarding this embodiment that are similar to those for the previously described embodiment will not be repeated herein.

Figure 29:
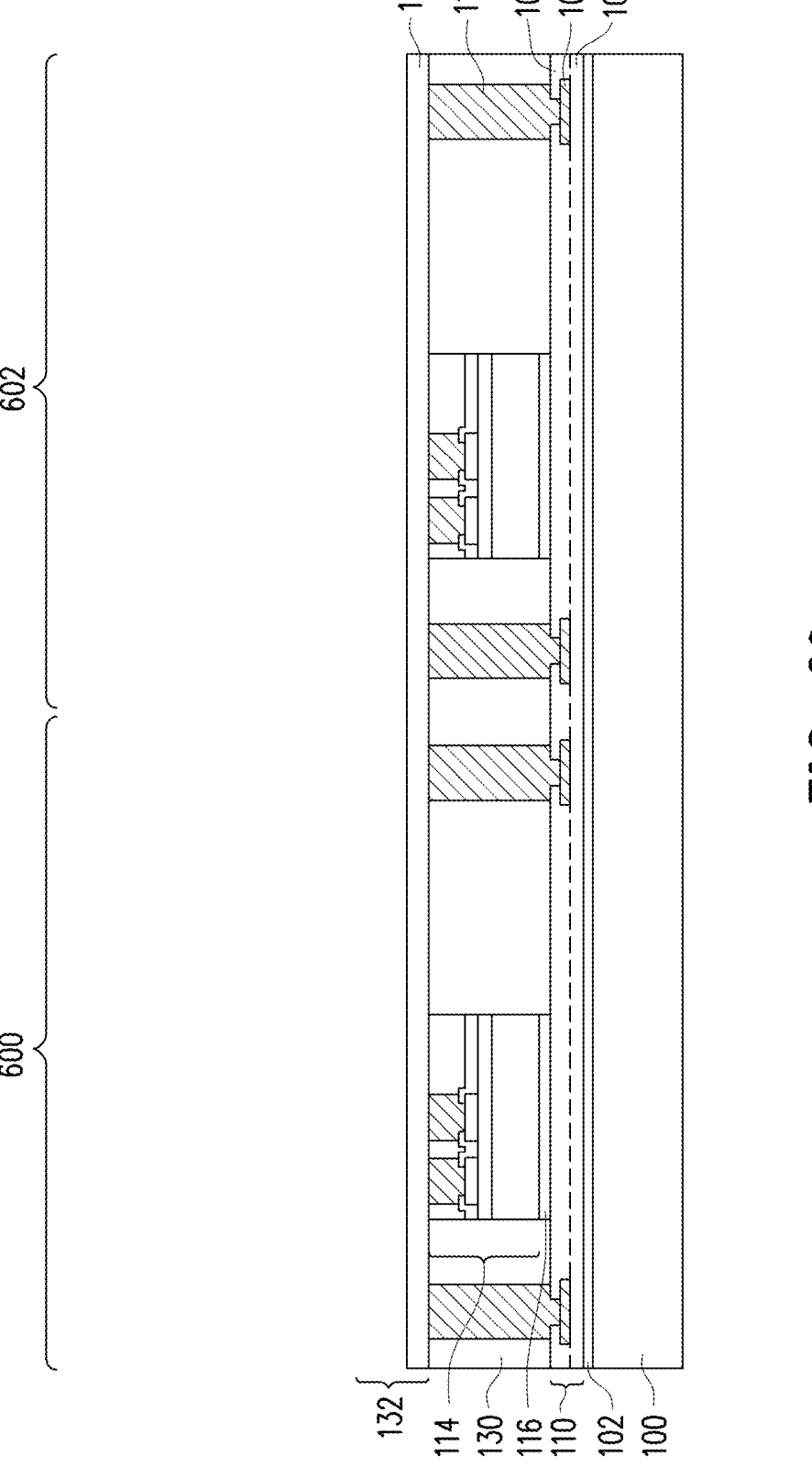
FIGS. 29, 30, 31, 32, 33, and 34 illustrate cross-sectional views of intermediate steps during a process for forming a package structure in accordance with some embodiments.

FIG. 29 illustrates an intermediate stage of processing similar to that described in FIG. 8 above and the description of forming this intermediate stage of processing is not repeated herein.

Figure 30:
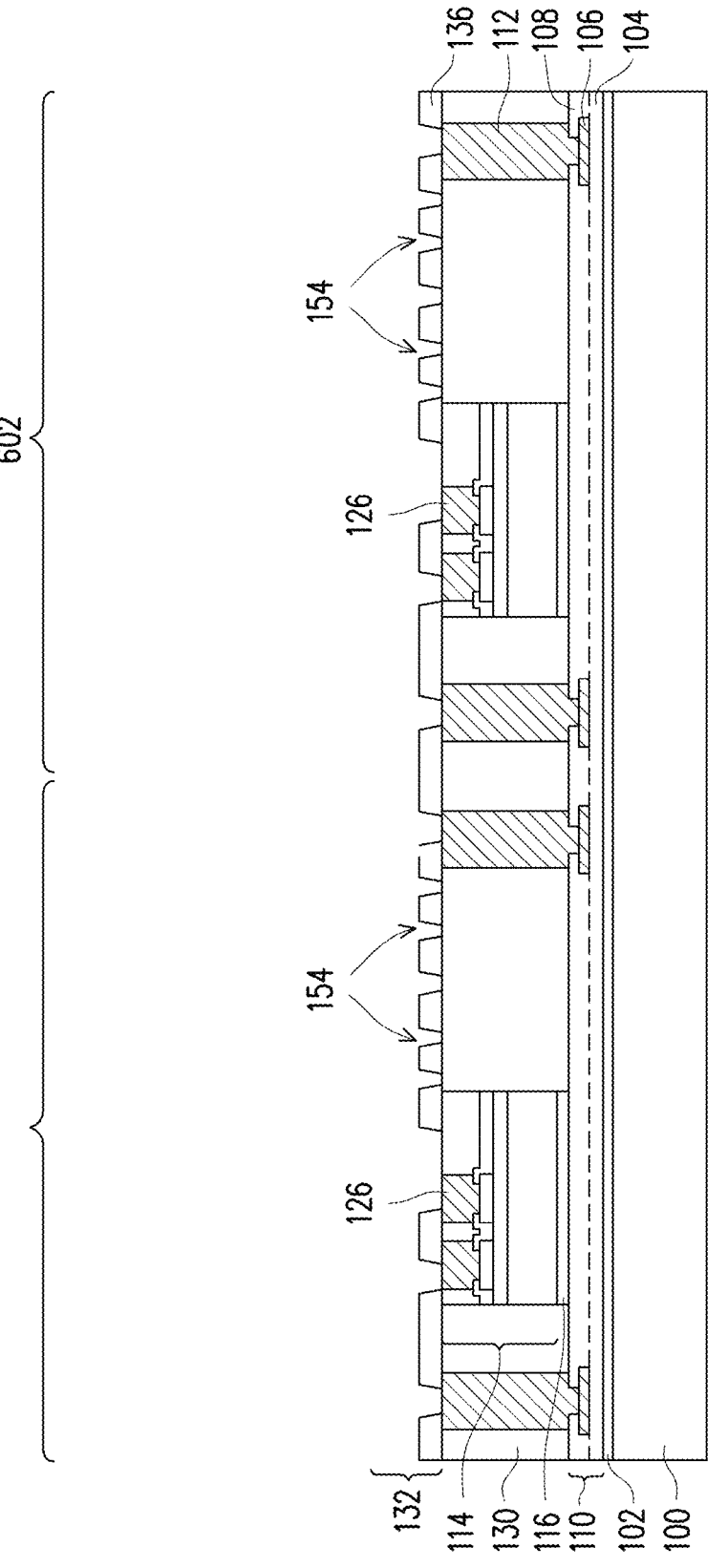

In FIG. 30, the dielectric layer 136 is patterned. The patterning forms openings to expose portions of the through vias 112 and the die connectors 126. The patterning may be by an acceptable process, such as by exposing the dielectric layer 136 to light when the dielectric layer 136 is a photo-sensitive material or by etching using, for example, an anisotropic etch. If the dielectric layer 136 is a photo-sensitive material, the dielectric layer 136 can be developed after the exposure.

This patterning step is similar to that described above in FIG. 9 but there are additional openings 154 in the embodiment in FIG. 30 that will be used to form the air gaps around the integrated component 150.

Figure 31:
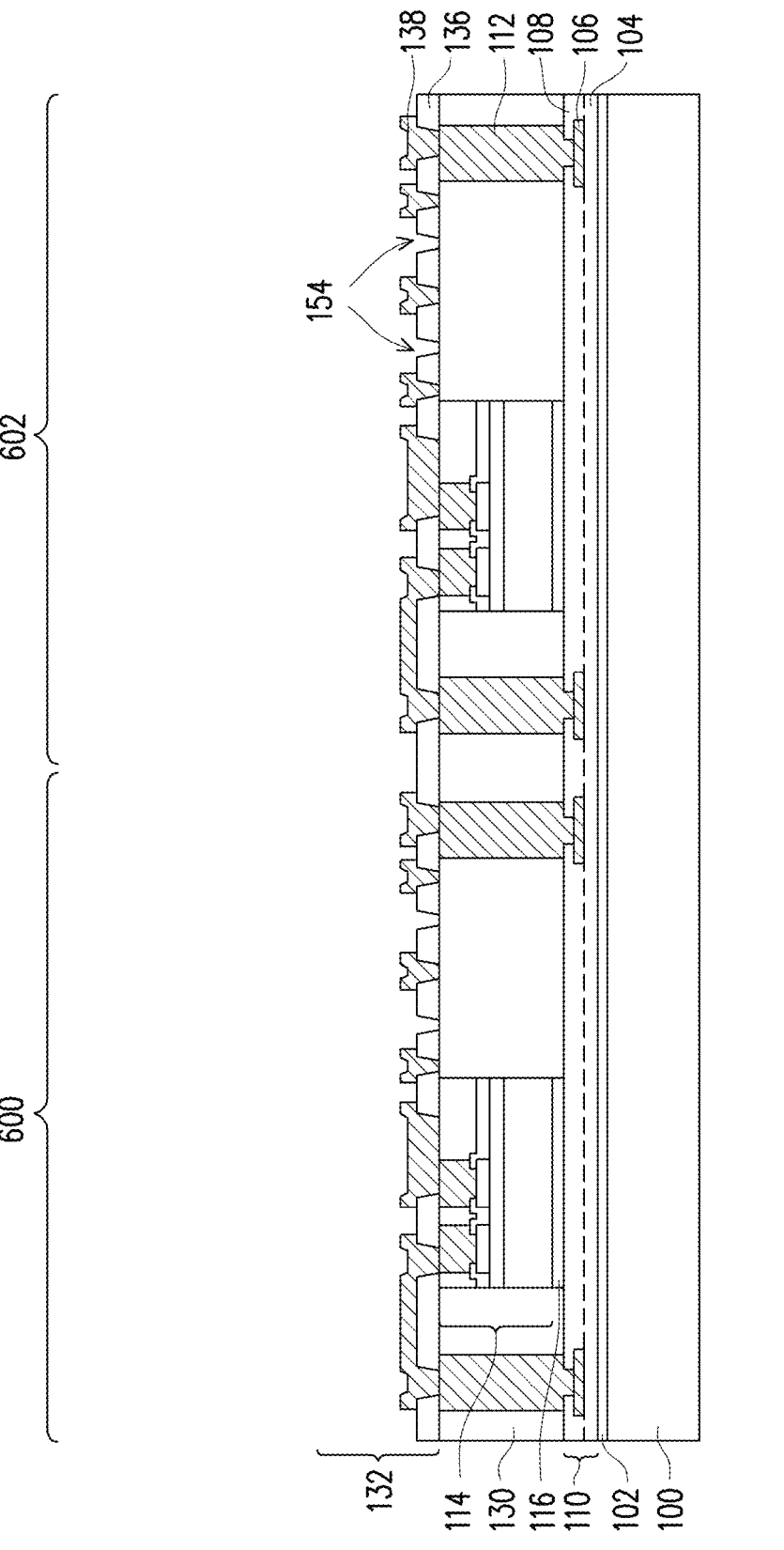
Figure 32:
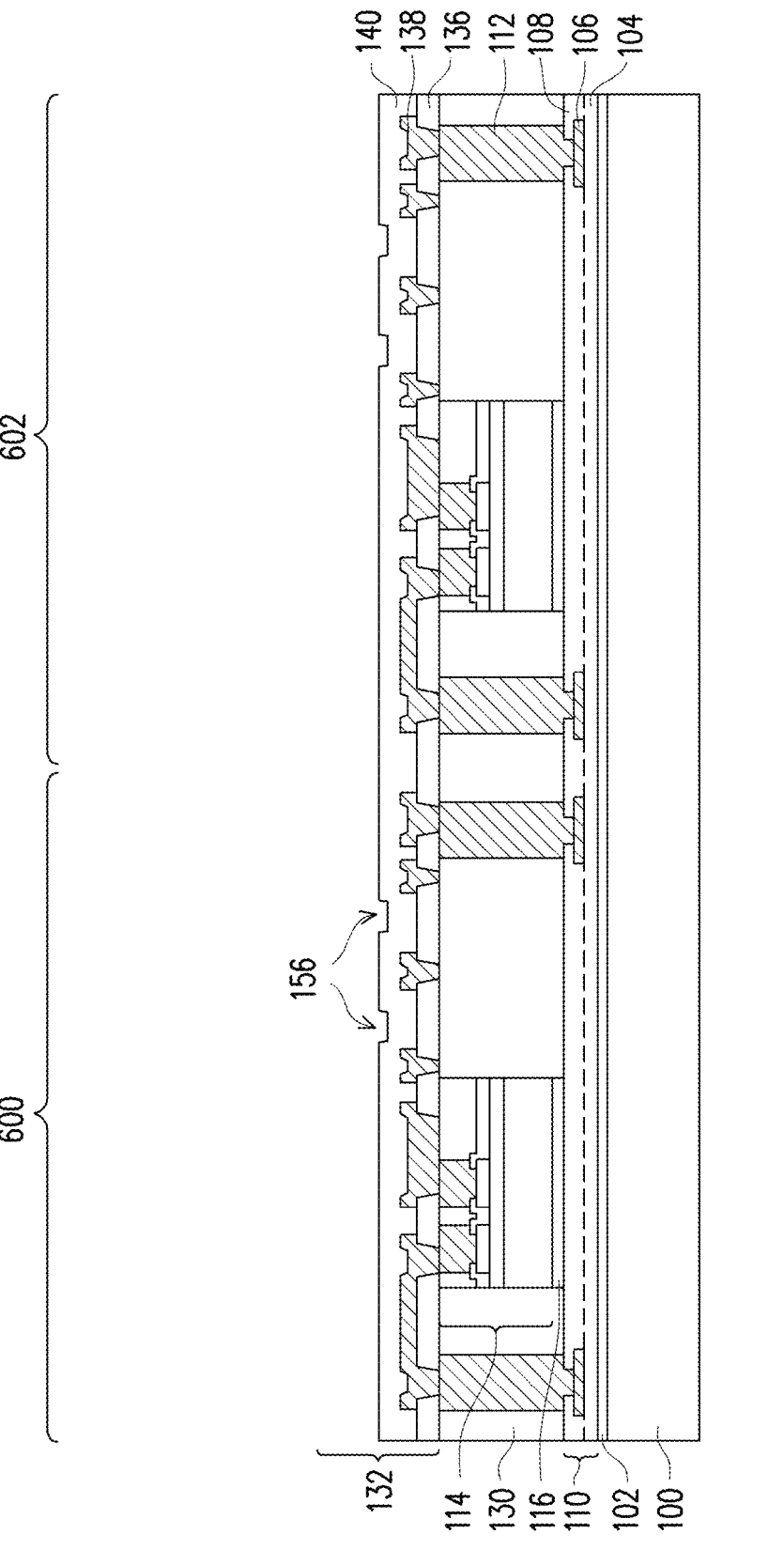

FIGS. 31 and 32 illustrate intermediate stages of processing similar to those described in FIGS. 10 and 11 above and the descriptions of forming these intermediate stages of processing are not repeated herein. In this embodiment, because the additional openings 154 were formed in the dielectric layer 136 and no metallization patterns or vias were formed in those openings 154, recesses 156 are present in the dielectric layer 140.

Figure 33:
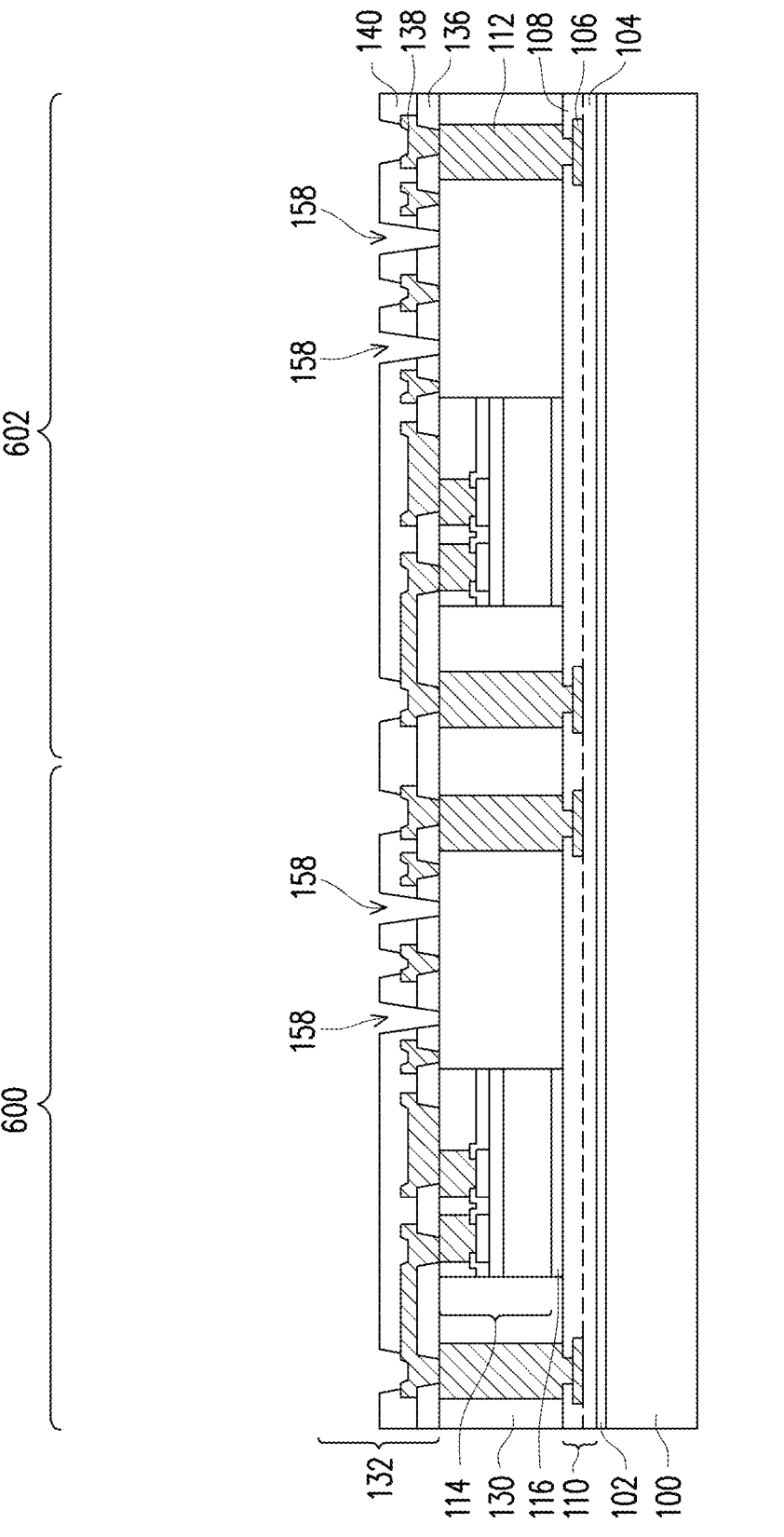

In FIG. 33, the dielectric layer 140 is then patterned. The patterning forms openings to expose portions of the metallization pattern 138 and openings 158 to expose the encapsulant 130. This same patterning process also patterns underlying dielectric layer 136 below the recesses 156 to form openings 158. The openings 158 extend from a top surface of the dielectric layer 140 to the encapsulant 130. The patterning may be by an acceptable process, such as by exposing the dielectric layer 140 to light when the dielectric layer is a photo-sensitive material or by etching using, for example, an anisotropic etch. If the dielectric layer 140 is a photo-sensitive material, the dielectric layer 140 can be developed after the exposure.

Figure 34:
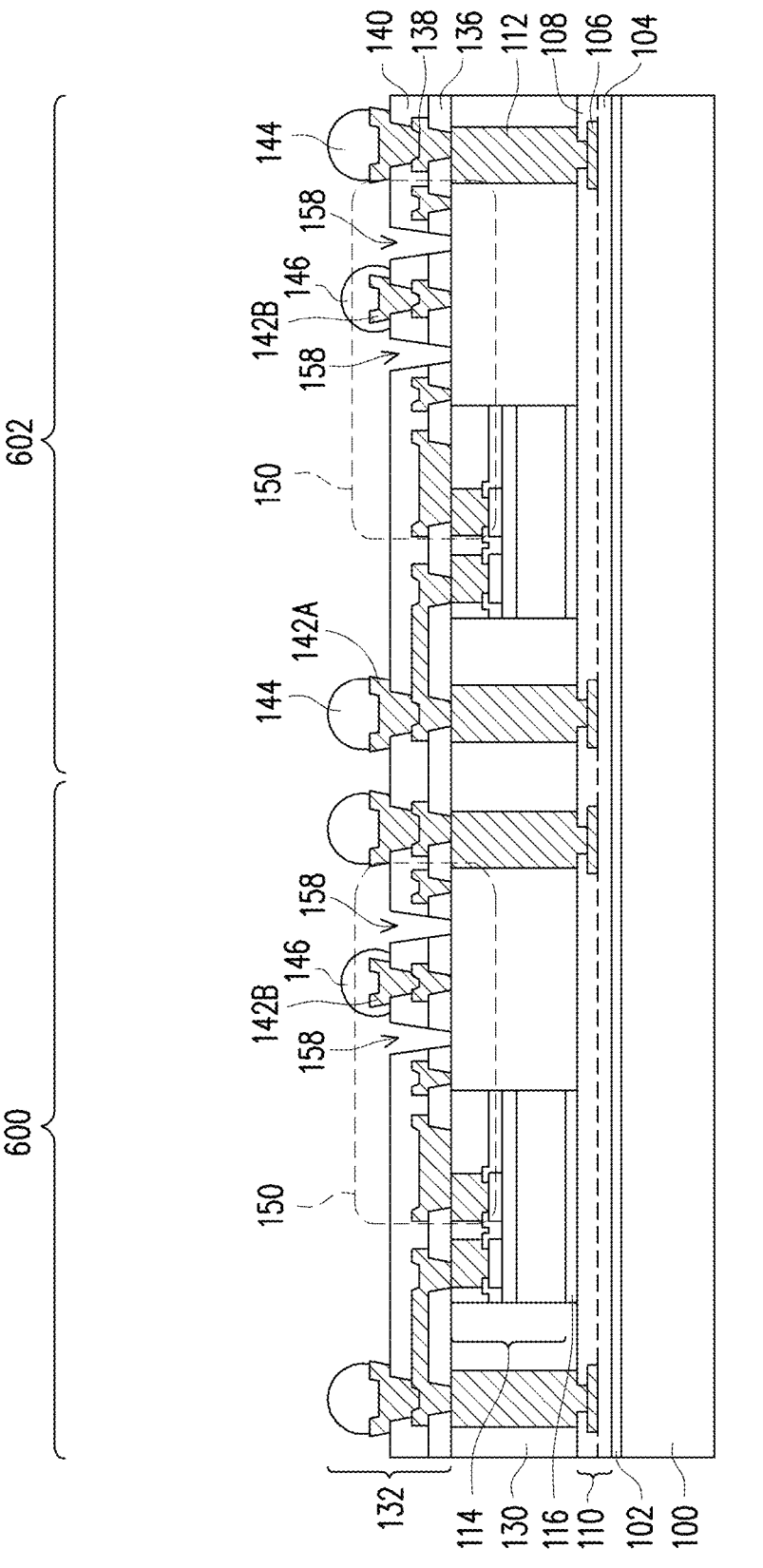

In FIG. 34, the protection layer 146 is formed to cover the pads 142B. Similar to the embodiment of FIG. 28, the protection layer 146 is only formed to cover the pads 142B and does not cover the entire front side redistribution structure 132. This embodiment still provides oxidation protection for the components 150 and also saves costs as compared to the embodiment of FIGS. 1 through 22.

After FIG. 34, the package structure may be further processed as described above in reference FIGS. 19 through 22 and the description is not repeated herein.

Figure 35:
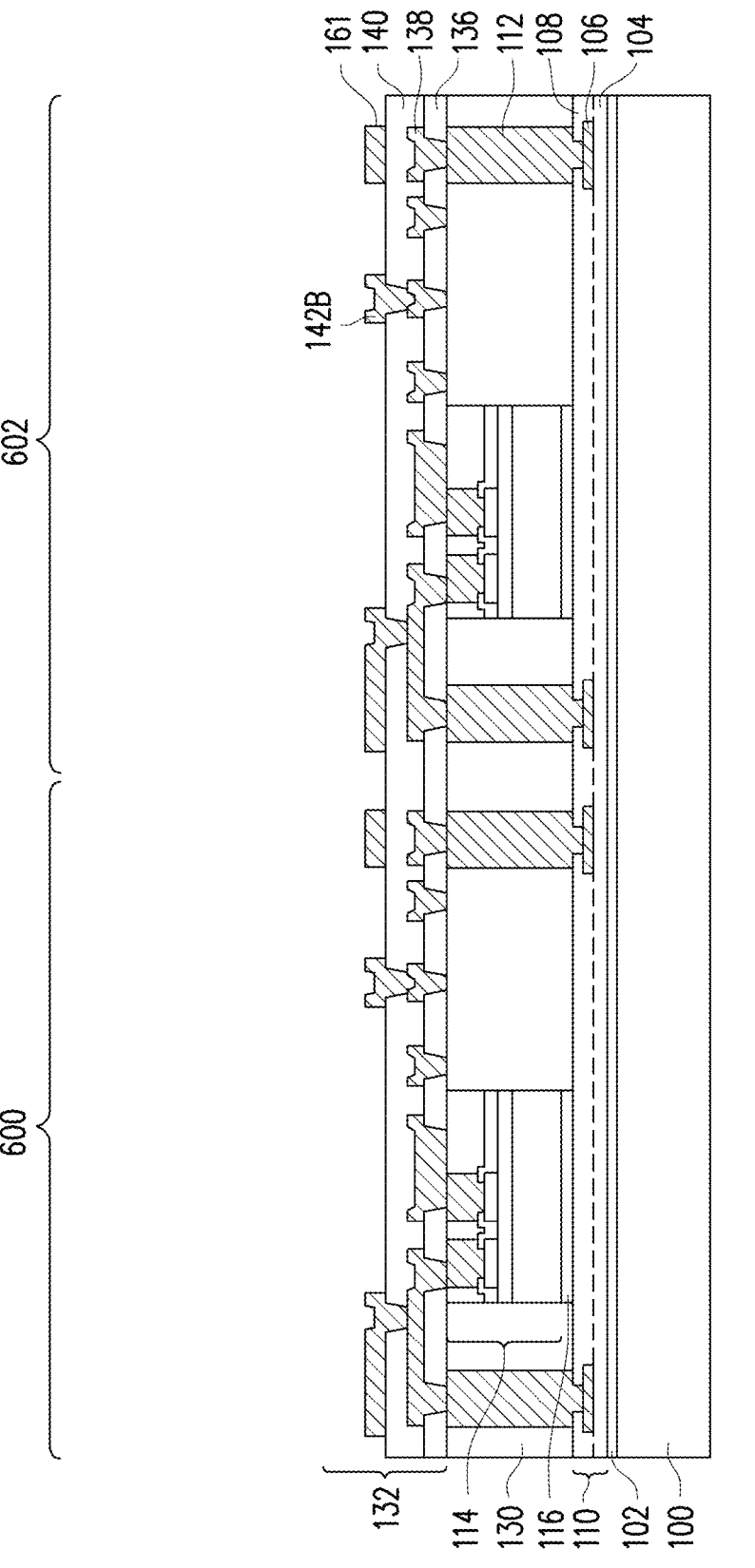
FIGS. 35, 36, and 37 illustrate cross-sectional views of intermediate steps during a process for forming a package structure in accordance with some embodiments.
Figure 36:
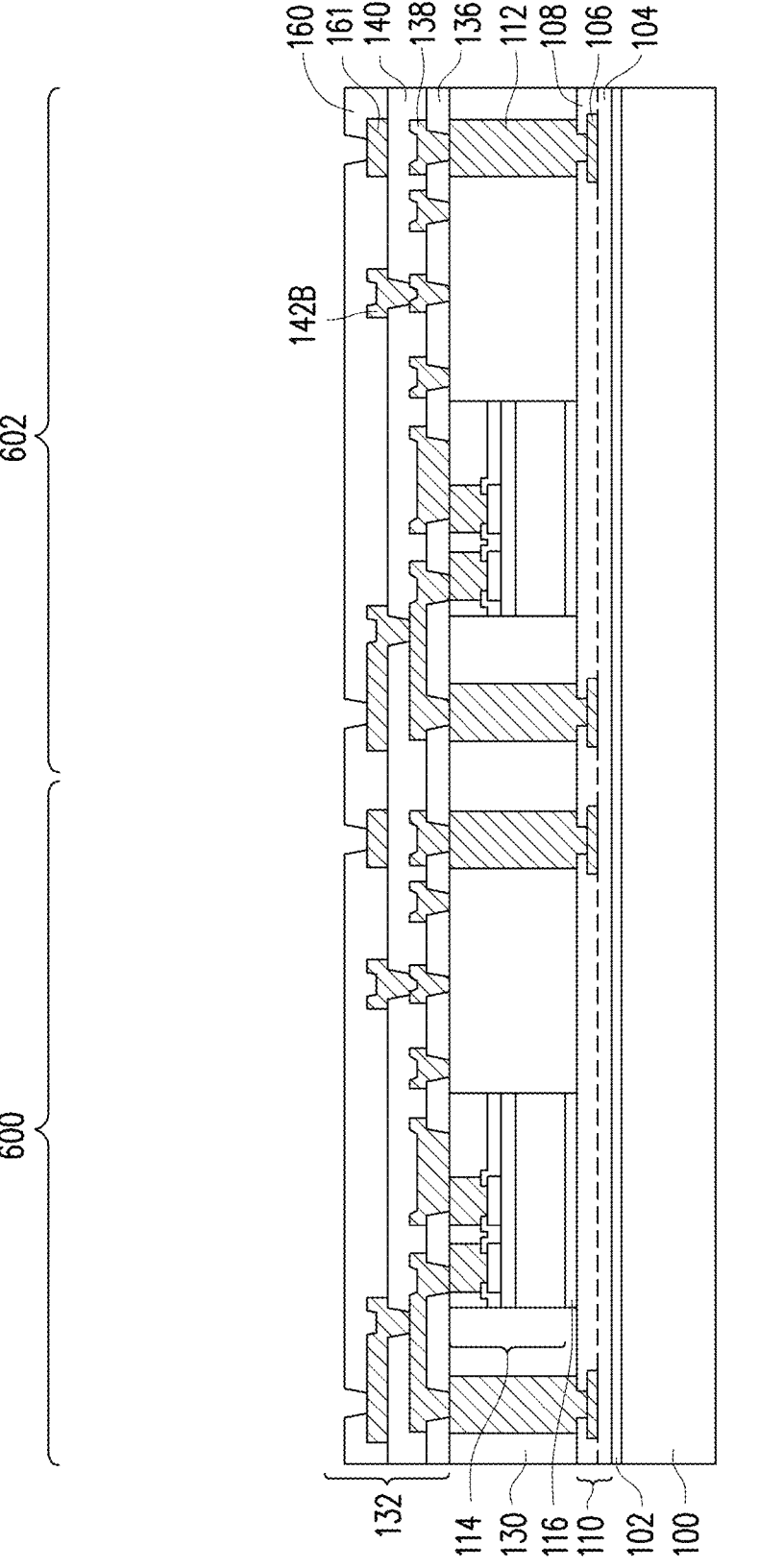
Figure 37:
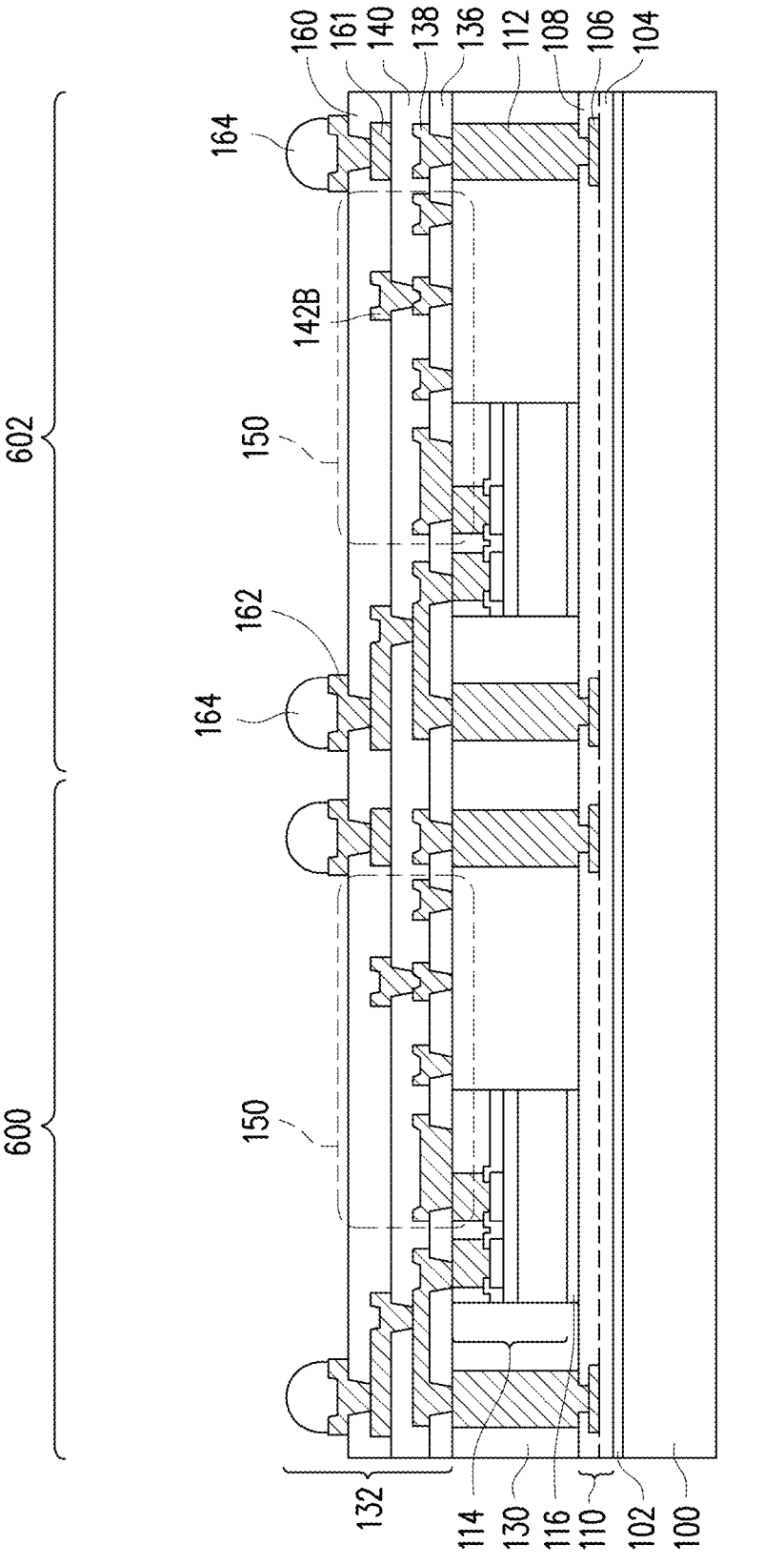

FIGS. 35 through 37 illustrate cross-sectional views of another package structure in accordance with some embodiments. The embodiment in FIGS. 35 through 37 is similar to the embodiment illustrated in FIGS. 1 through 22 except that in this embodiment, the protection layer 146 is omitted and the redistribution structure 132 includes another dielectric layer 160 to cover the pads 142B. Details regarding this embodiment that are similar to those for the previously described embodiment will not be repeated herein.

FIG. 35 illustrates an intermediate stage of processing similar to that described in FIG. 13 above and the description of forming this intermediate stage of processing is not repeated herein.

In FIG. 35, metallization pattern 161 with vias is formed on the dielectric layer 140. The pads 142B may be formed as a part of the metallization pattern 161. As an example, to form metallization pattern 161, a seed layer (not shown) is formed over the dielectric layer 140 and in openings through the dielectric layer 140. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 161. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 161 and vias. The vias are formed in openings through the dielectric layer 140 to, e.g., the metallization pattern 138.

In FIG. 36, dielectric layer 160 is formed over the dielectric layer 140 and metallization pattern 161. The materials and processes used to form dielectric layer 160 may be similar to the dielectric layer 140 the description is not repeated herein.

Further, in FIG. 36, the dielectric layer 160 is then patterned. The patterning forms openings to expose portions of the metallization pattern 161. The patterning may be by an acceptable process, such as by exposing the dielectric layer 160 to light when the dielectric layer is a photosensitive material or by etching using, for example, an anisotropic etch. If the dielectric layer 160 is a photosensitive material, the dielectric layer 160 can be developed after the exposure.

FIG. 37 illustrates further processing on the structure of FIG. 36. This processing is similar to that described above in FIGS. 13 and 14A and the descriptions are not repeated herein. In this embodiment, pads 162 being functionally similar to pads 142A and with conductive connectors 164 being functionally similar to conductive connectors 144.

Figure 38:
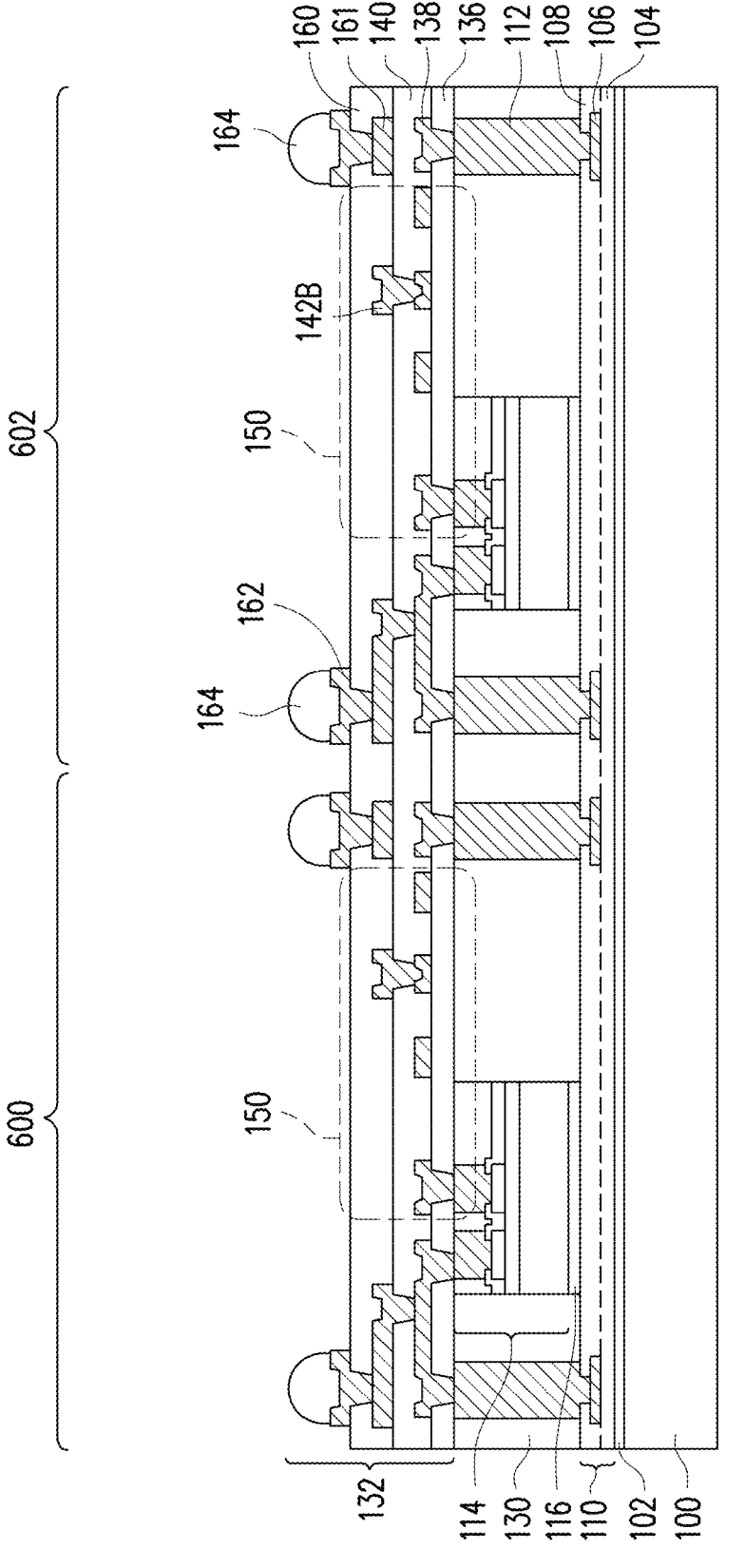
FIG. 38 illustrates a cross-sectional view of an intermediate steps during a process for forming a package structure in accordance with some embodiments.

FIG. 38 illustrates a cross-sectional view of another package structure in accordance with some embodiments. The embodiment in FIG. 38 is similar to the embodiment illustrated in Figures through 35 through 37 except that in this embodiment, the component 150 does not include the vias at the metallization pattern 138 but only the metallization pattern 138. Details regarding this embodiment that are similar to those for the previously described embodiment will not be repeated herein.

Embodiments may achieve advantages. Embodiments discussed herein include package structures (e.g., an InFO package structure) having a component—such as an inductor, a transformer, or both—integrated into a redistribution structure. The component being integrated into the redistribution structure can provide low cost and high performance component to improve performance of a radio frequency switch device. The improved performance of the radio frequency antenna switch may include improved insertion loss and improved isolation. For example, an inductor is able to cancel the parasitic/coupling effect of CMOS device. In addition, the disclosed embodiments include a protection layer to prevent oxidation of the conductive material of the inductor. Also, the disclosed embodiments include the conductive material of the inductor to be formed in a via trench of the redistribution structure to enable a higher Quality (Q) factor for the inductor and can also improve the performance of a transformer. Further, in some embodiments, the dielectric material of the redistribution structure adjacent the component can be removed (e.g., air gaps formed adjacent the component) to reduce the component's parasitic capacitance. The embodiments including the air gaps can improve the Q factor of the inductor and can also raise the self resonate frequency of the inductor. The disclosed embodiments including the inductor coupled to the radio frequency device switch can allow for the radio frequency switch device to have a lower power loss and a higher isolation when compared to a radio frequency switch device without an inductor and/or transformer.

An embodiment is a device including an integrated circuit die having an active side and a back side, the back side being opposite the active side, a molding compound encapsulating the integrated circuit die, and a first redistribution structure overlying the integrated circuit die and the molding compound, the first redistribution structure including a first metallization pattern and a first dielectric layer, the first metallization pattern being electrically coupled to the active side of the integrated circuit die, at least a portion of the first metallization pattern forming an inductor.

Embodiments may include one or more of the following features. The device further includes a conductive connector over the first redistribution structure, the conductive connector being electrically coupled to the first metallization pattern, and a protection layer over the first redistribution structure and adjacent the conductive connector, the protection layer over and contacting the inductor. The device where the protection layer contacts and surrounds the conductive connector. The device where the protection layer extends across an entirety of the first redistribution structure. The device where the protection layer has a different material composition than the first dielectric layer. The device where at least a portion of the first metallization pattern of the first redistribution structure forms a transformer. The device further includes a first through via extending through the molding compound, the first through via being electrically coupled to the first metallization pattern of the first redistribution structure. The device further includes a second redistribution structure under the integrated circuit die, the second redistribution structure including a second metallization pattern and a second dielectric layer, the second metallization pattern being electrically coupled to the through via, at least a portion of the second metallization pattern forming an antenna. The device further includes a second through via extending through the molding compound, the second through via being electrically coupled to the first metallization pattern of the first redistribution structure, the second through via being a part of an antenna. The device further includes a first opening extending through the first dielectric layer, the first opening being adjacent the inductor in the first redistribution structure.

An embodiment is a method including encapsulating an integrated circuit die with a molding compound, forming a first dielectric layer over the integrated circuit die and the molding compound, forming a first conductive via in the first dielectric layer, the first conductive via being electrically coupled to a first die connector of the integrated circuit die, forming a second conductive via in the first dielectric layer, the second conductive via being over the molding compound adjacent the integrated circuit die, forming a first metallization pattern over the first dielectric layer, forming a second dielectric layer over the first dielectric layer, the first conductive via, the second conductive via, and the first metallization pattern, forming a third conductive via in the second dielectric layer, the third conductive via being electrically coupled to the first metallization pattern, wherein the first conductive via, the second conductive via, the first metallization pattern, and the third conductive via form an inductor or transformer, and forming an insulating layer over the third conductive via and the second dielectric layer, the insulating layer covering the third conductive via.

Embodiments may include one or more of the following features. The method further includes forming a under bump metallization in the second dielectric layer, and forming a conductive connector over and electrically coupled to the under bump metallization. The method where the insulating layer contacts the under bump metallization and the conductive connector. The method where the insulating layer has a different material composition than the second dielectric layer. The method further includes forming an opening through the first and second dielectric layers, the opening being between the second and third conductive vias. The method further includes forming a third dielectric layer over the first dielectric layer, the first conductive via, and the second conductive via, the second dielectric layer being over the third dielectric layer, the first metallization pattern and the third conductive via directly overlying the second conductive via. The method further includes before encapsulating the integrated circuit die, forming a first redistribution structure, the first redistribution structure including a second metallization pattern and a third dielectric layer, and before encapsulating the integrated circuit die, forming a first electrical connector over and electrically coupled to the second metallization pattern of the first redistribution structure, the molding compound encapsulating the first electrical connector, the integrated circuit die and the molding compound being over the first redistribution structure, the first electrical connector extending through the molding compound and being electrically coupled to the first metallization pattern.

An embodiment is a method including forming a first package including forming an electrical connector over a carrier substrate, attaching a back side of a first die to the carrier substrate using an adhesive layer, the first die being adjacent the electrical connector, encapsulating the first die and the electrical connector with a molding compound, forming a first redistribution structure over the first die, the molding compound, and the electrical connector, the electrical connector being electrically coupled to the first redistribution structure, the first redistribution structure including a first integrated component, the first integrated component being an inductor or a transformer, and removing the carrier substrate.

Embodiments may include one or more of the following features. The method further includes bonding a second package to the first package using a first set of conductive connectors, the second package being proximate the back side of the first die, the second package comprising one more dies. The method further where forming the first package further includes before forming the electrical connector, forming a second redistribution structure over the carrier substrate, the electrical connector being electrically coupled to the second redistribution structure, wherein removing the carrier substrate exposes the second redistribution structure, after removing the carrier substrate, forming a dielectric layer on the exposed second redistribution structure, and forming conductive elements on the dielectric layer, the second redistribution structure, the dielectric layer, and the conductive elements forming a patch antenna.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
an integrated circuit die having an active side and a back side, the back side being opposite the active side;
a molding compound encapsulating the integrated circuit die;
a first redistribution structure overlying the integrated circuit die and the molding compound, the first redistribution structure comprising:
a first dielectric layer on the active side of the integrated circuit die and the molding compound;
a first metallization pattern in the first dielectric layer, the first metallization pattern being electrically coupled to the active side of the integrated circuit die;
a second dielectric layer over the first dielectric layer and the first metallization pattern;
a first conductive via in the second dielectric layer, the first conductive via being electrically coupled to the first metallization pattern, wherein the first conductive via and the first metallization pattern are at least a portion of an inductor; and
an under bump metallization in the second dielectric layer;
a conductive connector over and electrically coupled to the under bump metallization, the first conductive via being free from an overlying conductive connector; and
an insulating layer over the first conductive via and the second dielectric layer, the insulating layer covering the first conductive via, the insulating layer being spaced apart from the under bump metallization and the conductive connector.

2. The semiconductor package of claim 1, wherein the first metallization pattern further comprises a plurality of concentric rings with outer rings encircling inner rings to form the inductor, and wherein the plurality of concentric rings are serially connected to form a coil structure.

3. The semiconductor package of claim 2, wherein the concentric rings of the inductor are separated by air gaps formed in the first and second dielectric layers.

4. The semiconductor package of claim 1, wherein the insulating layer comprises a material selected from the group consisting of epoxy, resin, polyimide, polybenzoxazole (PBO), benzocyclobutene (BCB), silicone, acrylate, and combinations thereof.

5. The semiconductor package of claim 1, wherein the first conductive via and the first metallization pattern are configured to form a transformer.

6. The semiconductor package of claim 1, wherein the first redistribution structure further comprises a second conductive via electrically coupled to the first conductive via.

7. The semiconductor package of claim 1, wherein the insulating layer has a different material composition than the first dielectric layer.

8. A semiconductor device comprising:

an integrated circuit die having a first surface and a second surface opposite the first surface;

a molding compound encapsulating a periphery of the integrated circuit die;

a first redistribution structure disposed on the first surface of the integrated circuit die and over the molding compound, the first redistribution structure comprising:

a first dielectric layer formed on the first surface of the integrated circuit die and over the molding compound;

a metallization layer disposed on the first dielectric layer and electrically connected to the integrated circuit die;

a second dielectric layer formed over the metallization layer;

a conductive element formed within the second dielectric layer and electrically coupled to the metallization layer, wherein the conductive element and the metallization layer are a passive electrical component selected from the group consisting of an inductor and a transformer; and a conductive pad formed on the second dielectric layer and being a portion of the passive electrical component, the conductive pad being covered by a protective layer that is distinct from the second dielectric layer.

9. The semiconductor device of claim 8, further comprising:

a second redistribution structure disposed under the second surface of the integrated circuit die, the second redistribution structure comprising:

a third dielectric layer formed on the second surface of the integrated circuit die; and a second metallization layer disposed on the third dielectric layer and electrically connected to the integrated circuit die, wherein the second redistribution structure is configured to provide a ground plane for the semiconductor device.

10. The semiconductor device of claim 8, further comprising:

an air gap formed within the first redistribution structure adjacent to the passive electrical component.

11. The semiconductor device of claim 8 wherein the protective layer has a different material composition than the second dielectric layer.

12. The semiconductor device of claim 8, wherein the first redistribution structure further comprises an antenna structure integrated within the metallization layer.

13. The semiconductor device of claim 8, wherein the second dielectric layer comprises a polymer selected from the group consisting of polybenzoxazole (PBO), polyimide, and benzocyclobutene (BCB).

14. A semiconductor device comprising:

a first dielectric layer over a substrate;

a first metallization pattern on the first dielectric layer, the first metallization pattern being a part of a back side redistribution structure;

an integrated circuit die on the back side redistribution structure;

an encapsulant at least laterally surrounding the integrated circuit die;

a front side redistribution structure over the encapsulant and the integrated circuit die, wherein the front side redistribution structure includes a second dielectric layer and a second metallization pattern configured to form at least one of an inductor or a transformer, wherein an air gap is adjacent to the at least one of the inductor or the transformer within the front side redistribution structure; and a protection layer over the front side redistribution structure to cover the at least one of the inductor or the transformer.

15. The semiconductor device of claim 14, further comprising:

a second package bonded to the back side redistribution structure using a first set of conductive connectors, the second package comprising one or more dies.

16. The semiconductor device of claim 15, wherein the one or more dies of the second package comprises stacked memory dies.

17. The semiconductor device of claim 14, wherein the second dielectric layer of the front side redistribution structure comprises a polymer selected from the group consisting of polybenzoxazole (PBO), polyimide, and benzocyclobutene (BCB).

18. The semiconductor device of claim 14, wherein the air gap extends through the front side redistribution structure to the encapsulant.

19. The semiconductor device of claim 14, wherein the protection layer comprises a material selected from the group consisting of epoxy, a resin, a polyimide, polybenzoxazole (PBO), benzocyclobutene (BCB), a silicone, an acrylate, and a polymer with or without a silica-based or glass filler added.

20. The semiconductor device of claim 14, wherein the protection layer covers areas of the front side redistribution structure that include the at least one of the inductor or the transformer, while leaving other areas of the front side redistribution structure uncovered.

*    *    *    *    *